(12) United States Patent
An et al.

(10) Patent No.: US 8,860,072 B2
(45) Date of Patent: *Oct. 14, 2014

(54) LIGHT EMITTING DEVICE AND LIGHT UNIT HAVING THE SAME

(71) Applicant: LG Innotek Co., Ltd., Seoul (KR)

(72) Inventors: Joong In An, Seoul (KR); Sung Min Kong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/690,764

(22) Filed: Nov. 30, 2012

(65) Prior Publication Data

US 2013/0087817 A1 Apr. 11, 2013

Related U.S. Application Data

(63) Continuation of application No. 13/110,106, filed on May 18, 2011, now Pat. No. 8,324,654.

(30) Foreign Application Priority Data

May 24, 2010 (KR) .......................... 10-2010-0048291

(51) Int. Cl.
| | |
|---|---|
| *H01L 33/00* | (2010.01) |
| *H01L 29/20* | (2006.01) |
| *H01L 29/207* | (2006.01) |
| *H01L 23/48* | (2006.01) |
| *H01L 23/52* | (2006.01) |
| *H01L 29/40* | (2006.01) |
| *H01L 33/44* | (2010.01) |
| *H01L 33/48* | (2010.01) |
| *H01L 33/08* | (2010.01) |
| *H01L 25/075* | (2006.01) |
| *H01L 33/62* | (2010.01) |
| *H01L 33/54* | (2010.01) |
| *F21K 99/00* | (2010.01) |
| *F21Y 101/02* | (2006.01) |

(52) U.S. Cl.
CPC ............. *H01L 33/08* (2013.01); *H01L 25/0753* (2013.01); *H01L 33/44* (2013.01); *H01L 2224/48137* (2013.01); *H01L 33/62* (2013.01);
*H01L 33/486* (2013.01); *H01L 2224/49113* (2013.01); *H01L 33/54* (2013.01); *F21K 9/13* (2013.01); *H01L 2924/19107* (2013.01); *H01L 2933/0033* (2013.01); *F21Y 2101/02* (2013.01); *H01L 2224/48247* (2013.01)
USPC ................... 257/99; 257/89; 257/93; 257/98; 257/100; 257/784; 257/E33.058; 257/E33.059; 257/E33.061; 257/E33.066; 257/E33.068

(58) Field of Classification Search
None
See application file for complete search history.

(56) References Cited

U.S. PATENT DOCUMENTS

| | | | |
|---|---|---|---|
| 7,319,245 B2 | 1/2008 | Brunner et al. | |
| 7,429,757 B2 | 9/2008 | Oyama et al. | |

(Continued)

FOREIGN PATENT DOCUMENTS

| | | |
|---|---|---|
| DE | 10 2008 003 971 | 1/2008 |
| EP | 2 138 753 A1 | 12/2009 |

(Continued)

OTHER PUBLICATIONS

European Search Report dated Aug. 29, 2011 for Application No. 11 16 7007.

(Continued)

*Primary Examiner* — Hoang-Quan Ho
(74) *Attorney, Agent, or Firm* — KED & Associates LLP

(57) ABSTRACT

A light emitting device includes a body having a first recess; a barrier section having a second recess and a third recess, protruding upward over a bottom surface of the first recess, and dividing the bottom surface of the first recess into a first region and a second region; a first light emitting diode disposed in the first region; a second light emitting diode disposed in the second region; a first lead electrode disposed in the first region; a second lead electrode disposed in the second region; a first wire electrically connecting the first lead electrode to the second light emitting diode through the second recess; and a second wire electrically connecting the second lead electrode to the first light emitting diode through the third recess.

20 Claims, 32 Drawing Sheets

(56) References Cited

U.S. PATENT DOCUMENTS

| | | |
|---|---|---|
| 7,435,997 B2 | 10/2008 | Arndt et al. |
| 7,455,423 B2 | 11/2008 | Takenaka |
| 7,598,528 B2 | 10/2009 | Oh et al. |
| 7,679,281 B2 | 3/2010 | Kim et al. |
| 7,700,964 B2 | 4/2010 | Morimoto et al. |
| 7,759,692 B2 | 7/2010 | Hata et al. |
| 7,815,343 B2 | 10/2010 | Nii et al. |
| 7,847,303 B2 | 12/2010 | Jung et al. |
| 7,906,789 B2 | 3/2011 | Jung et al. |
| 7,919,339 B2 | 4/2011 | Hsu |
| 7,982,237 B2 | 7/2011 | Kim et al. |
| 7,985,980 B2 | 7/2011 | Matsuda et al. |
| 8,039,850 B2 | 10/2011 | Lee et al. |
| 8,206,999 B2 | 6/2012 | Matsuda |
| 8,324,654 B2 * | 12/2012 | An et al. ............ 257/99 |
| 2003/0222268 A1 * | 12/2003 | Yocom et al. ............ 257/98 |
| 2004/0056265 A1 | 3/2004 | Arndt et al. |
| 2004/0232435 A1 | 11/2004 | Hofer et al. |
| 2005/0045903 A1 | 3/2005 | Abe et al. |
| 2005/0225222 A1 | 10/2005 | Mazzochette et al. |
| 2006/0001055 A1 | 1/2006 | Ueno et al. |
| 2006/0065957 A1 | 3/2006 | Hanya |
| 2006/0245188 A1 | 11/2006 | Takenaka |
| 2006/0261357 A1 | 11/2006 | Tsou et al. |
| 2007/0153159 A1 | 7/2007 | Jung |
| 2007/0246729 A1 * | 10/2007 | Park ............ 257/99 |
| 2007/0257335 A1 | 11/2007 | O'Brien |
| 2008/0042151 A1 | 2/2008 | Oh et al. |
| 2008/0164484 A1 | 7/2008 | Lee |
| 2008/0253107 A1 * | 10/2008 | Lin ............ 362/84 |
| 2008/0259598 A1 | 10/2008 | Sumitani et al. |
| 2009/0014749 A1 | 1/2009 | Matsuda |
| 2009/0108271 A1 | 4/2009 | Chou et al. |
| 2009/0303694 A1 | 12/2009 | Roth et al. |
| 2010/0001648 A1 | 1/2010 | De Clercq et al. |
| 2010/0025700 A1 | 2/2010 | Jung et al. |
| 2010/0084681 A1 | 4/2010 | Nakajima et al. |
| 2010/0090231 A1 | 4/2010 | Jung et al. |
| 2010/0128199 A1 | 5/2010 | Kim et al. |
| 2010/0133561 A1 | 6/2010 | Lee |
| 2010/0157583 A1 | 6/2010 | Nakajima |
| 2010/0320482 A1 | 12/2010 | Tachibana |
| 2011/0186885 A1 * | 8/2011 | Schweighart ............ 257/98 |
| 2011/0186898 A1 | 8/2011 | Lan et al. |
| 2011/0278605 A1 | 11/2011 | Agatani et al. |
| 2011/0291114 A1 | 12/2011 | Cheng |
| 2012/0194131 A1 * | 8/2012 | Osswald ............ 320/112 |

FOREIGN PATENT DOCUMENTS

| | | |
|---|---|---|
| JP | 2007-231253 A | 9/2007 |
| JP | 2008-041699 A | 2/2008 |
| KR | 10-2005-0070349 A | 7/2005 |
| KR | 10-2009-0059622 A | 6/2009 |
| KR | 10-2010-0030805 | 3/2010 |
| KR | 10-2010-0042126 A | 4/2010 |
| WO | WO 02/17401 A1 | 2/2002 |

OTHER PUBLICATIONS

European Communication for Application 11 167 007.1 dated Oct. 11, 2012.

U.S. Office Action for parent U.S. Appl. No. 13/110,106 dated Dec. 22, 2011.

U.S. Notice of Allowance for parent U.S. Appl. No. 13/110,106 dated Jul. 26, 2012.

* cited by examiner

110 ly of light emitting diodes comprising a first diode
LIGHT EMITTING DEVICE AND LIGHT UNIT HAVING THE SAME This application is a continuation of application Ser. No. 13/110,106 filed on May 18, 2011, which claims priority to Korean Patent Application No. 10-2010-0048291 filed on May 24, 2010. The entire contents of all of the above applications are hereby incorporated by reference.

BACKGROUND

The embodiment relates to a light emitting device and a light unit having the same.

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps used in indoor/outdoor, liquid crystal displays, electric signboards, and street lamps.

BRIEF SUMMARY

The embodiment provides a light emitting device, in which a barrier section is disposed in a recess to divide the recess into a plurality of regions.

The embodiment provides a light emitting device comprising a plurality of light emitting diodes disposed in divisional regions of a recess to emit lights having different peak wavelengths.

The embodiment provides a light emitting device comprising same phosphors or different phosphors disposed in divisional regions of a recess.

The embodiment provides a light emitting device comprising a barrier section having a concave part formed with a stepped portion or an inclined portion in a recess.

The embodiment provides a light unit comprising a plurality of light emitting devices.

A light emitting device according to the embodiment comprises a body having a recess; a barrier section protruding upward over a bottom surface of the recess and dividing the bottom surface of the recess into a plurality of regions; a plurality of light emitting diodes comprising a first diode disposed in a first region of the bottom surface of the recess and a second diode disposed in a second region of the bottom surface of the recess; a plurality of lead electrodes spaced apart from each other in the recess and selectively connected to the light emitting diodes; wires connecting the lead electrodes to the light emitting diodes; a resin layer in the recess; and at least one concave part in the barrier section, wherein the concave part has a height lower than a top surface of the barrier section and higher than the bottom surface of the recess and the wires are provided in the concave part to connect the lead electrodes to the light emitting diodes disposed in opposition to each other.

A light unit according to the embodiment comprises a light emitting module comprising a light emitting device and a board on which the light emitting device is arrayed; and a light guide plate disposed in a path of a light emitted from the light emitting module, wherein the light emitting device comprises a body having a recess; a barrier section protruding upward over a bottom surface of the recess and dividing the bottom surface of the recess into a plurality of regions; a plurality of light emitting diodes comprising a first diode disposed in a first region of the bottom surface of the recess and a second diode disposed in a second region of the bottom surface of the recess; a plurality of lead electrodes spaced apart from each other in the recess and selectively connected to the light emitting diodes; wires connecting the lead electrodes to the light emitting diodes; a resin layer in the recess; and at least one concave part in the barrier section, and wherein the concave part has a height lower than a top surface of the barrier section and higher than the bottom surface of the recess and the wires are provided in the concave part to connect the lead electrodes to the light emitting diodes disposed in opposition to each other.

The embodiment can improve the excitation efficiency of a phosphor in a light emitting device.

The embodiment can improve the light extraction efficiency in a light emitting device.

The embodiment can provide a light emitting device capable of improving the color reproduction rate.

The embodiment can provide the reliability of a light emitting device.

DETAILED DESCRIPTION OF THE EMBODIMENTS

Figure 1:
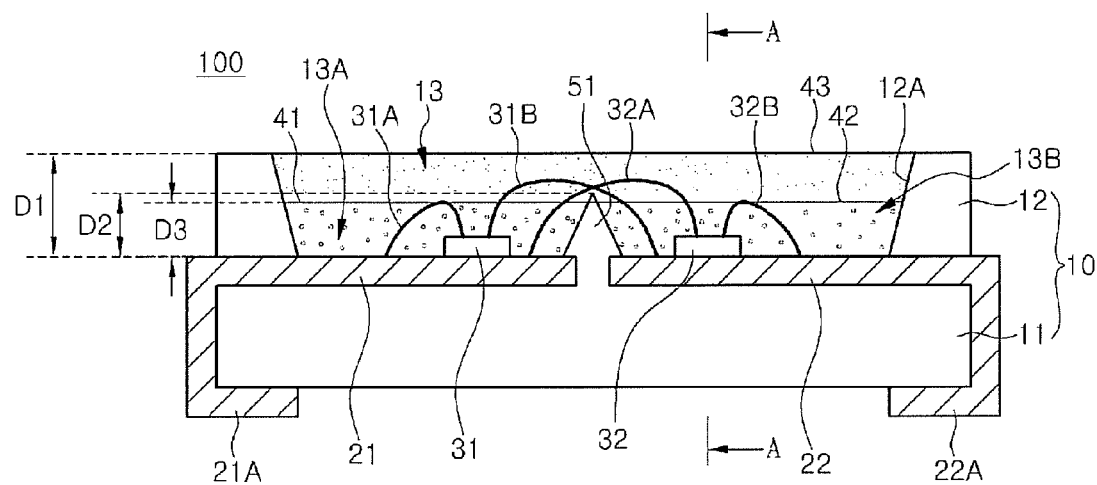
FIG. 1 is a sectional view showing of a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the embodiments will be described with reference to accompanying drawings.

Figure 2:
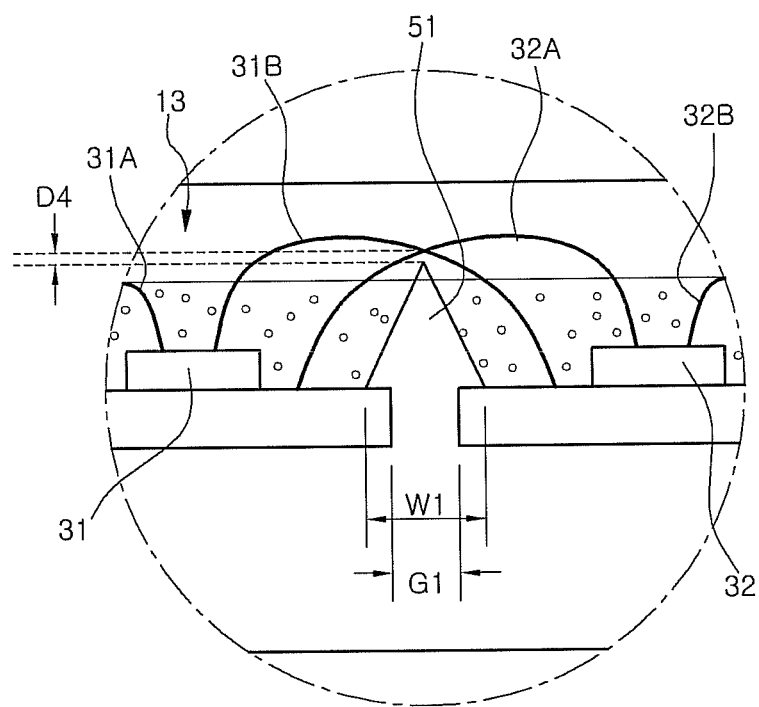
FIG. 2 is a partially enlarged view of FIG. 1.
Figure 3:
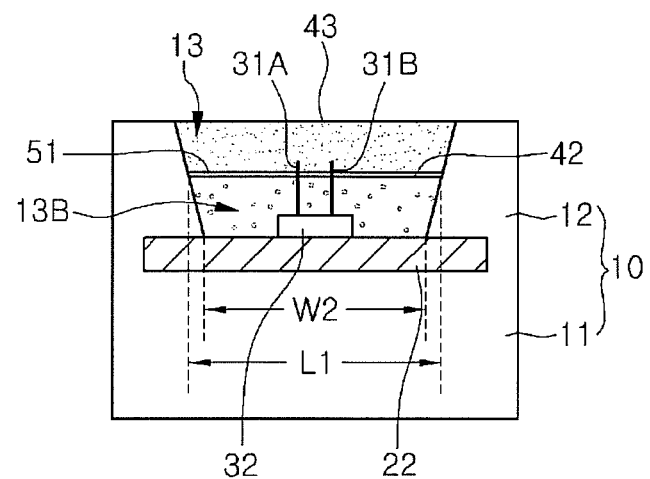
FIG. 3 is a section view taken along A-A of FIG. 1.
Figure 4:
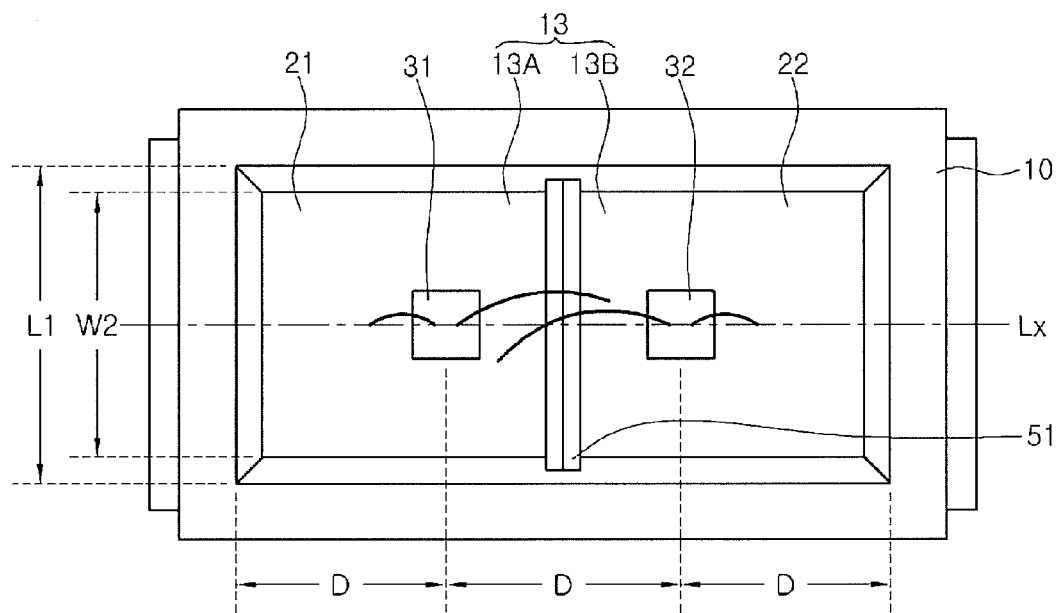
FIG. 4 is a plan view of FIG. 1.

FIG. 1 is a sectional view showing of a light emitting device according to the first embodiment, FIG. 2 is a partially enlarged view of FIG. 1, FIG. 3 is a section view taken along A-A of FIG. 1, and FIG. 4 is a plan view of FIG. 1.

Referring to FIGS. 1 to 4, the light emitting device 100 may comprise a body 10, lead electrodes 21 and 22, light emitting diodes 31 and 32, resin layers 41, 42 and 43, and a barrier section 51.

The body 10 may be formed by using an insulating material. For instance, the body 10 may comprise at least one of a resin material, such as PPA (polyphthalamide), LCP (liquid crystal polymer) or PA9T (polyamide9T), a metallic material, PSG (photo sensitive glass), sapphire (Al$_2$O$_3$), and a PCB (printed circuit board).

The body 10 may have various shapes depending on the application and design of the light emitting device 100. When viewed from the top, the body 10 may have a rectangular shape, a polygonal shape or a circular shape.

A cathode mark may be formed at an upper portion of the body 10. The cathode mark may sort the first and second lead electrodes 21 and 22 of the light emitting device 100, thereby preventing the confusion for the polarity direction of the first and second lead electrodes 21 and 22.

The body 10 may comprise a base part 11 and a reflective part 12. The base part 11 supports the light emitting device 100 from the bottom of the reflective part 12. The reflective part 12 may comprise a recess 13, which is formed around a peripheral portion of a top surface of the base part 11 and has an open top surface, and reflects the light emitted from the light emitting diodes 31 and 32. The reflective part 12 may be formed by using a material same to the material for the base part 11 and may be integrally formed with the base part 11. In addition, the reflective part 12 may be formed by using a material different from the material for the base part 11. In this case, the reflective part 12 and the base part 11 may be formed by using the insulating material.

The recess 13 is formed in the reflective part 12. The recess 13 has a concave shape having an open top shape. The lead electrodes 21 and 22 are provided on a bottom of the recess 13 while being electrically separated from each other.

An inner wall of the reflective part 12 may be a circumference of the recess 13, which may be perpendicular or inclined at an angle of about 10° to about 80°, but the embodiment is not limited thereto. An edge portion of the inner wall of the reflective part 12 provided between two adjacent planes may be curved or inclined at a predetermined angle. When viewed from the top, the recess 13 may have a circular shape, an oval shape or a polygonal shape, but the embodiment is not limited thereto.

At least two lead electrodes 21 and 22 are provided while being electrically separated from each other. The lead electrodes 21 and 22 may be metal plates having a predetermined thickness. A metal layer may be coated on the metal plates, but the embodiment is not limited thereto. The lead electrodes 21 and 22 may comprise a metallic material. For instance, the lead electrodes 21 and 22 may comprise at least one of Ti, Cu, Ni, Au, Cr, Ta, Pt, Sn, Ag, and P. In addition, the lead electrodes 21 and 22 may comprise a single-layer structure or a multi-layer structure, but the embodiment is not limited thereto.

The lead electrodes 21 and 22 are provided on the bottom of the recess 13 and are exposed to the outside by passing through the body 10. In detail, the lead electrodes 21 and 22 are exposed to the outside by passing through between the base part 11 and the reflective part 12 of the body 10. In addition, other ends 21A and 22A of the lead electrodes 21 and 22 are disposed on a bottom surface or an outer side of the body 10 so as to be used as electrode terminals. In addition, the lead electrodes 21 and 22 can be provided in the base part 11 of the body 10 as a via structure, but the embodiment is not limited thereto.

The light emitting diodes 31 and 32 may be provided in the recess 13. The light emitting diodes 31 and 32 may emit lights having colors same to or different from each other. The light emitting diodes 31 and 32 may emit the light of a visible ray band, such as a red light, a green light, a blue light or a white light, or an ultraviolet band, but the embodiment is not limited thereto.

The light emitting diodes 31 and 32 may be prepared as a horizontal chip in which two electrodes are aligned in parallel to each other, and/or as a vertical chip in which two electrodes are aligned in opposition to each other. The horizontal chip may be connected to at least two wires and the vertical chip may be connected to at least one wire.

As shown in the drawings, the light emitting diodes 31 and 32 are electrically connected to the first and second lead electrode 22 through the wire bonding scheme, the flip chip scheme or the die bonding scheme.

The first light emitting diode 31 is connected to the first and second lead electrodes 21 and 22 through a plurality of wires 31A and 31B, and the second light emitting diode 32 is connected to the first and second lead electrodes 21 and 22 through a plurality of wires 32A and 32B.

The barrier section 51 is disposed between the first and second light emitting diodes 31 and 32. The barrier section 51 protrudes upward from the base part 11 of the body 10 and comprises a material same to the material for the body 10. In addition, the barrier section 51 may comprise an insulating material different from the material for the body 10, but the embodiment is not limited thereto.

The bottom surface of the recess 13 may be divided into at least two regions 13A and 13B by the barrier section 51. The divisional regions 13A and 13B may have the same size or different size, but the embodiment is not limited thereto.

As shown in FIG. 2, the barrier section 51 has a sectional shape, in which a width W1 of a lower portion is larger than a width of an upper portion. For instance, the barrier section 51 may have a sectional shape comprising at least one of a triangle, a rectangle, a trapezoid, a hemisphere, and a combination thereof. The lower width W1 of the barrier section 51 may be larger than a gap G1 between the first and second lead electrodes 21 and 22. In this case, the amount of moisture penetrating into the body 10 through the gap G1 between the first and second lead electrodes 21 and 22 can be reduced.

The height D2 of the barrier section 51 can be measured from the bottom surface of the recess 13 or the top surface of the first and second lead electrodes 21 and 22. For instance, the barrier section 51 may have the height of about 20 µm or above, preferably, about 100 µm to about 150 µm. In addition, the height D2 of the barrier section 51 is longer than a thickness of the light emitting diodes 31 and 32 and shorter than a depth D1 of the recess 13. The barrier section 51 is positioned lower than the wires 31B and 32A extending above the barrier section 51. For instance, the wires 31B and 32A are disposed such that a gap D4 having a size of abut 50 µm may be formed between the wires 31B and 32A and the top surface of the barrier section 51. As shown in FIG. 3, a length L1 of the top surface of the barrier section 51 is longer than a width W2 of the bottom surface of the recess 13, but the embodiment is not limited thereto.

As shown in FIG. 1, transitive resin layers 41, 42 and 43 can be formed in the recess 13. The resin layers 41, 42 and 43 may comprise a resin material, such as transparent epoxy or silicone. In addition, a phosphor, an air gap or a diffusion agent may be selectively added to the resin layers 41, 42 and 43, but the embodiment is not limited thereto. A lens may be formed on the resin layers 41, 42 and 43. The lens may comprise a concave lens, a convex lens or a concavo-convex lens.

The first resin layer 41 may be formed in the first region 13A of the recess 13 and the second resin layer 42 may be formed on the second region 13B of the recess 13 about the barrier section 51. The first and second resin layers 41 and 42 may have the height lower than the top end of the barrier section 51. In this case, the first resin layer 41 is physically separated from the second resin layer 42 by the barrier section 51.

The third resin layer 43 may be formed at the upper portion of the recess 13. The third resin layer 43 may be formed on the first and second resin layers 41 and 42. A phosphor having a predetermined color may be added to the third resin layer 43 or not, and the embodiment is not limited thereto.

The first and second resin layers 41 and 42 may have flat top surfaces. In addition, the first and second resin layers 41 and 42 may have the concave shapes or the convex shapes. The top surface of the third resin layer 43 may have a flat shape, a concave shape or a convex shape, but the embodiment is not limited thereto. In addition, the first and second resin layers 41 and 42 may comprise a material (for instance, epoxy) softer than the material for the third resin layer 43, but the embodiment is not limited thereto.

Figure 32:
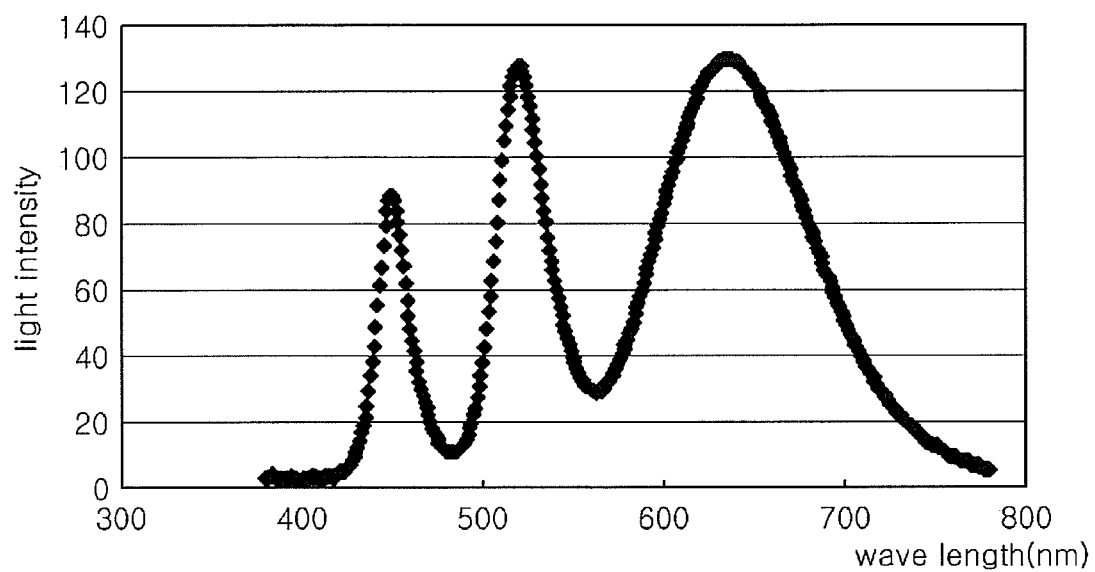
FIG. 32 is a graph showing an output wavelength of a light emitting device package shown in FIG. 1.

According to the embodiment, the first light emitting diode 31 may be a blue LED chip and the second light emitting diode 32 may be a green LED chip. In this case, a red phosphor may be added to the first and second resin layers 41 and 42. The red phosphor of the first resin layer 41 absorbs the light having a blue wavelength to emit the light having a red wavelength, and the red phosphor of the second resin layer 42 absorbs the light having a green wavelength to emit the light having the red wavelength. According to the embodiment, the light having the blue wavelength and the light having the red wavelength are emitted through a region where the first light emitting diode 31 is disposed, and the light having the green wavelength and the light having the red wavelength are emitted through a region where the second light emitting diode 32 is disposed. Thus, the light having the red, green and blue wavelength can be effectively emitted, so that the color reproduction rate can be improved. In detail, as shown in FIG. 32, a blue wavelength spectrum (about 430 nm to about 480 nm), a green wavelength spectrum (about 500 nm to about 550 nm) and a red wavelength spectrum (about 600 nm to about 690 nm) may be extracted with a light intensity having a predetermined level. Thus, as shown in FIG. 32, the light intensity of the green wavelength and the red wavelength may be 120 or above. A package structure of the light emitting device may improve the efficiency of the white color as compared with the case in which the blue LED chip and the yellow phosphor are provided in one recess 13. In addition, the blue LED chip and the green LED chip may be driven under the same driving voltage, so the interconnection problem caused by potential difference can be simply solved.

Meanwhile, as shown in FIG. 4, the light emitting diodes 31 and 32 are arrayed on the same axis Lx. The first and second light emitting diodes 31 and 32 may disposed within a predetermined distance (D/2) about the barrier section 51. The distance D between the light emitting diodes 31 and 32 in the recess 13 is same to the distance D between each light emitting diode 31 or 32 and the circumference of the recess 13.

Figure 5:
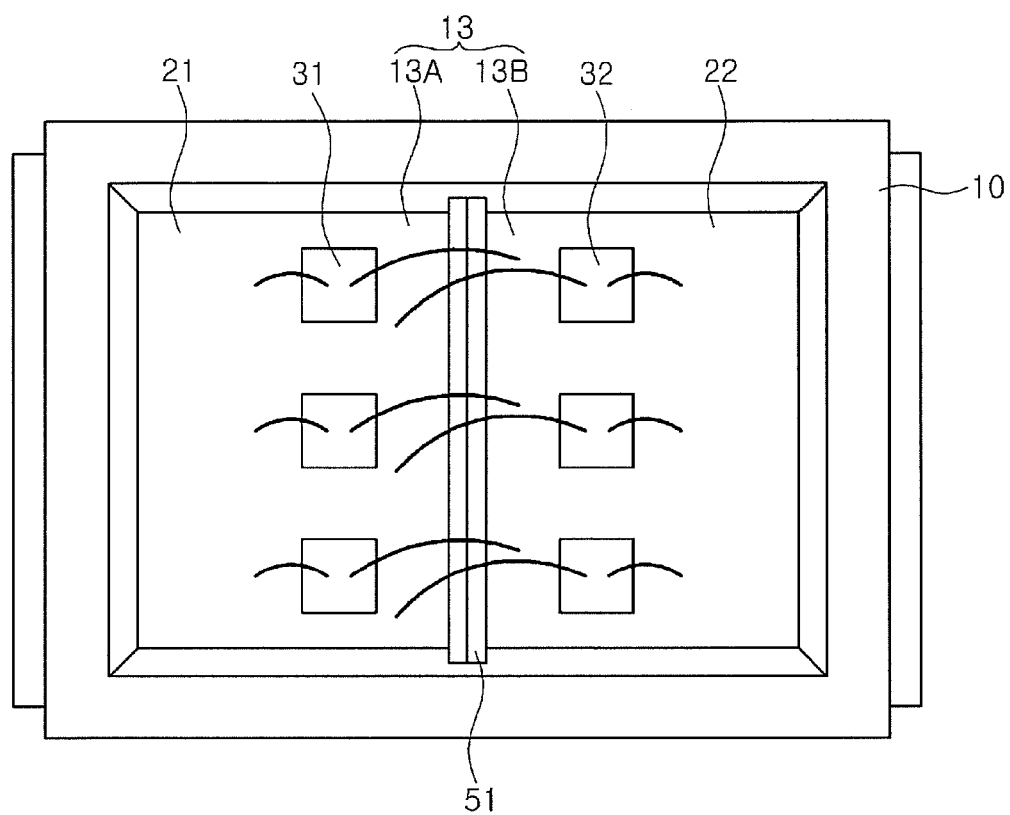
FIG. 5 is a plan view of a light emitting device according to another embodiment.

As shown in FIG. 5, a plurality of first light emitting diodes 31 may be disposed in the first region 13A of the recess 13 and a plurality of second light emitting diodes 32 may be disposed in the second region 13B of the recess 13. The first and second light emitting diodes 31 and 32 may be connected with each other in series or parallel, but the embodiment is not limited thereto.

Figure 6:
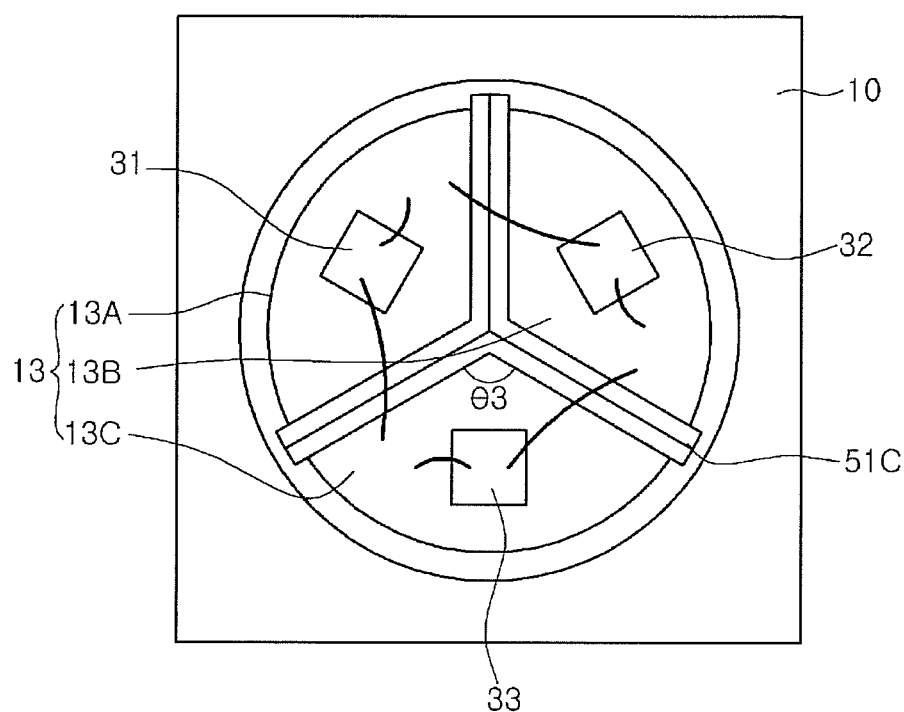
FIG. 6 is a plan view of a light emitting device according to still another embodiment.

As shown in FIG. 6, a plurality of barrier sections 51C may be formed in the recess 13. Two adjacent barrier sections 51C may extend to the circumference of the recess 13 while forming a predetermined angle therebetween (for instance, θ3: about 120°) about the center of the recess 13. The bottom surface of the recess 13 may be divided into at least three regions by the barrier sections 51C. The angle θ3 may vary depending on the number of the regions divided by the barrier sections 51C, and the embodiment is not limited thereto. At least one light emitting diode 31, 32 or 33 may be disposed in each region 13A, 13B or 13C and the light emitting diode 31, 32 or 33 disposed in each region 13A, 13B or 13C may be covered with a resin layer. The light emitting diode 31, 32 or 33 may comprise a UV LED chip and a red phosphor, a green phosphor or a blue phosphor is added to the resin layer of each region 13A, 13B or 13C to provide the white light. In addition, the light emitting diode 31, 32 or 33 may comprise a red LED chip, a green LED chip or a blue LED chip. In addition, the light emitting diode 31, 32 or 33 may comprise the same LED chip, but the embodiment is not limited thereto. The resin layer and the barrier sections 51C have the height as shown in FIG. 1.

Figure 7:
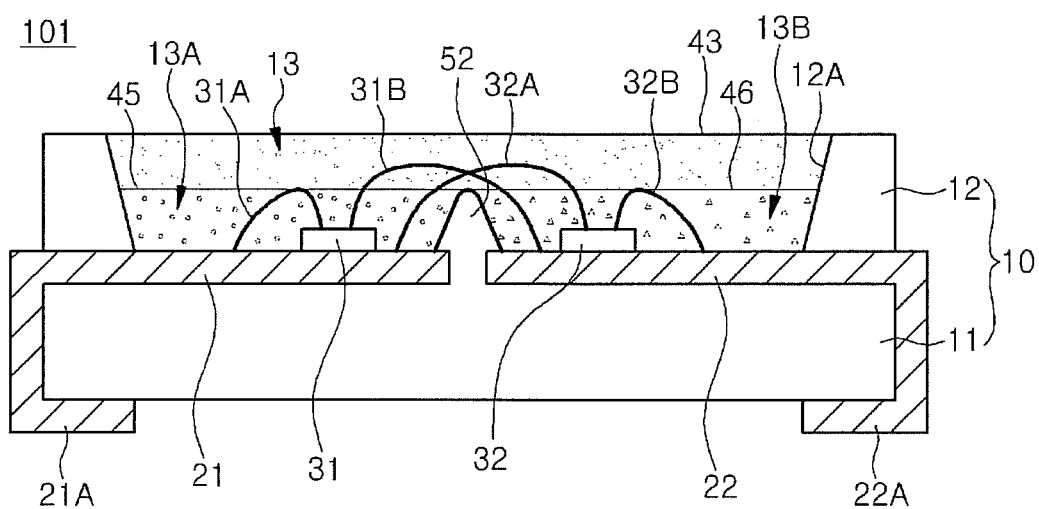
FIG. 7 is a sectional view of a light emitting device according to the second embodiment.

FIG. 7 is a sectional view showing a light emitting device according to the second embodiment.

Referring to FIG. 7, the light emitting device 101 may comprise a barrier section 52 disposed in the recess 13. A first resin layer 45 may be formed in the first region 13A divided by the barrier section 52 to cover the first light emitting diode 31 and a second resin layer 46 may be formed in the second region 13B to cover the second light emitting diode 32. The first light emitting diode 31 may be a blue LED chip, the second light emitting diode 32 may be a UV LED chip, a red phosphor may be added to the first resin layer 45, and a green phosphor may be added to the second resin layer 46. Thus, the light emitting device 101 may emit the lights having the color of blue, red and green. If there is a difference in driving voltage between the blue LED chip and the UV LED chip, a parallel circuit pattern can be provided, but the embodiment is not limited to such a circuit pattern. In addition, a red phosphor or a green phosphor may be added to the third resin layer 43, but the embodiment is not limited thereto.

Figure 8:
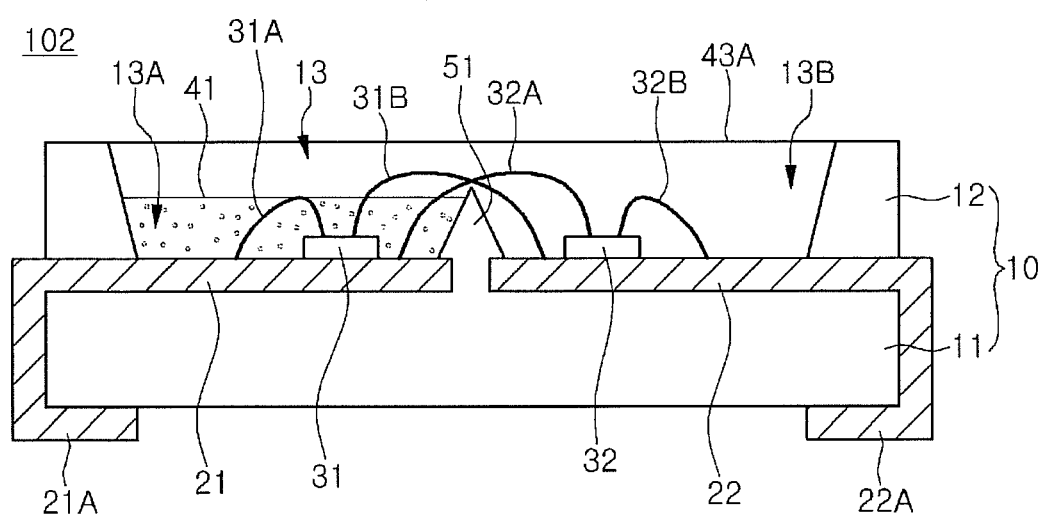
FIG. 8 is a sectional view of a light emitting device according to the third embodiment.

FIG. 8 is a sectional view showing a light emitting device according to the third embodiment.

Referring to FIG. 8, the light emitting device may comprise a barrier section 51. The first light emitting diode 31 and the first resin layer 41 may be formed in the first region 13A of the recess 13 and the second light emitting diode 32 may be formed in the second region 13B of the recess 13 about the barrier section 51. A third resin layer 43A may be formed on the first resin layer 41 and in the second region 13B.

The first light emitting diode 31 may be a blue LED chip, the second light emitting diode 32 may be a green LED chip, and a red phosphor may be added to the first resin layer 41. This package structure absorbs a part of the light having the blue wavelength to convert the light into the red light, thereby reducing loss of the green light.

Figure 9:
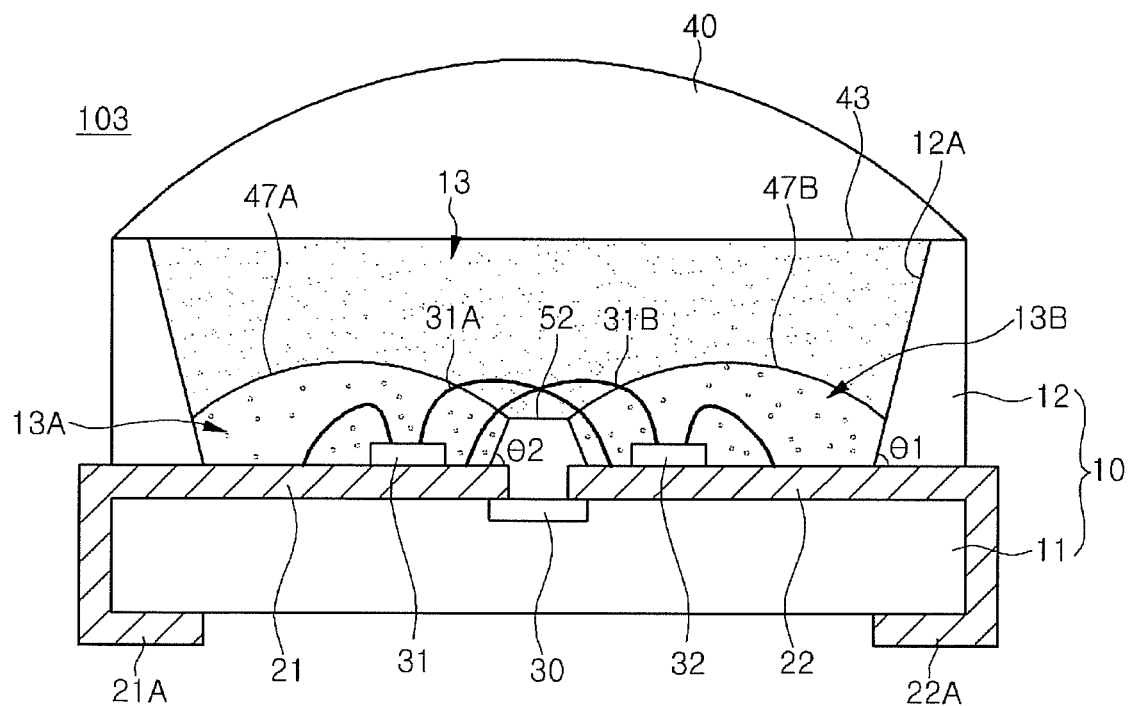
FIG. 9 is a sectional view of a light emitting device according to the fourth embodiment.

FIG. 9 is a sectional view showing a light emitting device according to the fourth embodiment.

Referring to FIG. 9, the light emitting device 103 may comprise first and second light emitting diodes 31 and 32 opposite to each other about the barrier section 52, and a protective device 30 disposed below the barrier section 52 under the lead electrodes 21 and 22. The protective device 30 may be electrically connected to a bottom surface of the lead electrodes 21 and 22 and embedded in the base part 11. The protective device 30 may comprise a Zener diode or a TVS (Transient voltage suppression) diode.

The barrier section 52 may have a trapezoidal sectional shape and both sides of the barrier section 52 correspond to both sides of the recess 13. A side inclination angle θ2 of the barrier section 52 may be same to or different from a side inclination angle θ1 of the reflective part 12. If the side inclination angle θ2 of the barrier section 52 is different from the side inclination angle θ1 of the reflective part 12, the following equation is satisfied: θ1>θ2. Under the above angle condition, the light may be induced to be mixed at the upper portion of the recess 13 in the package.

The first and second resin layers 47A and 47B formed in the recess may have the convex lens shape, and a convex lens 40 may be formed on the third resin layer 43.

Figure 10:
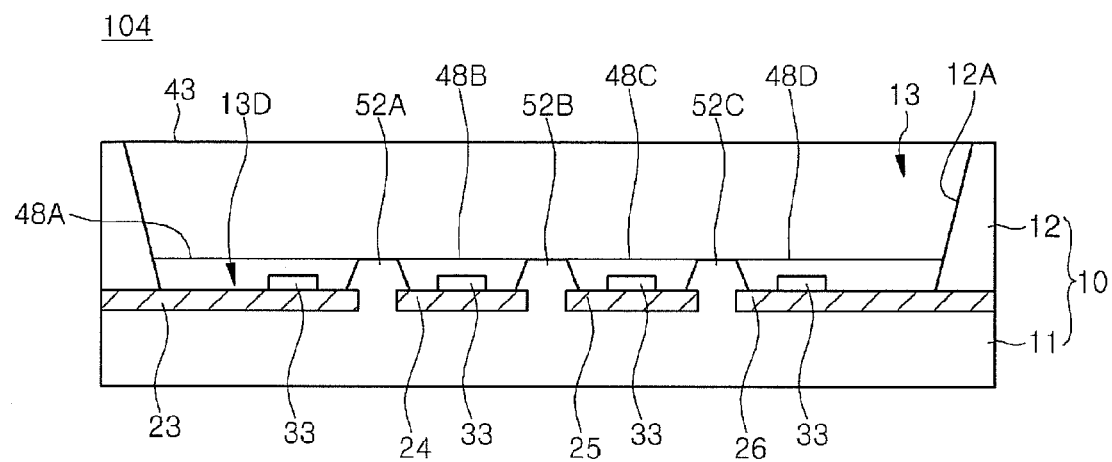
FIG. 10 is a sectional view of a light emitting device according to the fifth embodiment.

FIG. 10 is a sectional view showing a light emitting device according to the fifth embodiment.

Referring to FIG. 10, the light emitting device 104 may comprise a plurality of barrier sections 52A, 52B and 52C in the recess 13. The barrier sections 52A, 52B and 52C may be aligned lengthwise along the body 10 at a predetermined interval. Lead electrodes 23, 24, 25 and 26 may be provided on regions 13D divided by the barrier sections 52A, 52B and 52C, respectively, and light emitting diodes 33 may be provided on the lead electrodes 23, 24, 25 and 26, respectively. The light emitting diodes 33 may comprise LED chips for emitting lights having the same color or at least two colors. For instance, the light emitting diodes 33 may be prepared as blue LED chips. In addition, the light emitting diodes 33 may comprise two blue LED chips and two green LED chips.

The light emitting diodes 33 may be connected with each other in series or parallel, but the embodiment is not limited thereto.

Resin layers 48A, 48B, 48C and 48D are disposed on the regions 13D divided by the barrier sections 52A, 52B and 52C. A red phosphor or a phosphor having the other color may be added to the resin layers 48A, 48B, 48C and 48D, but the embodiment is not limited thereto.

Figure 11:
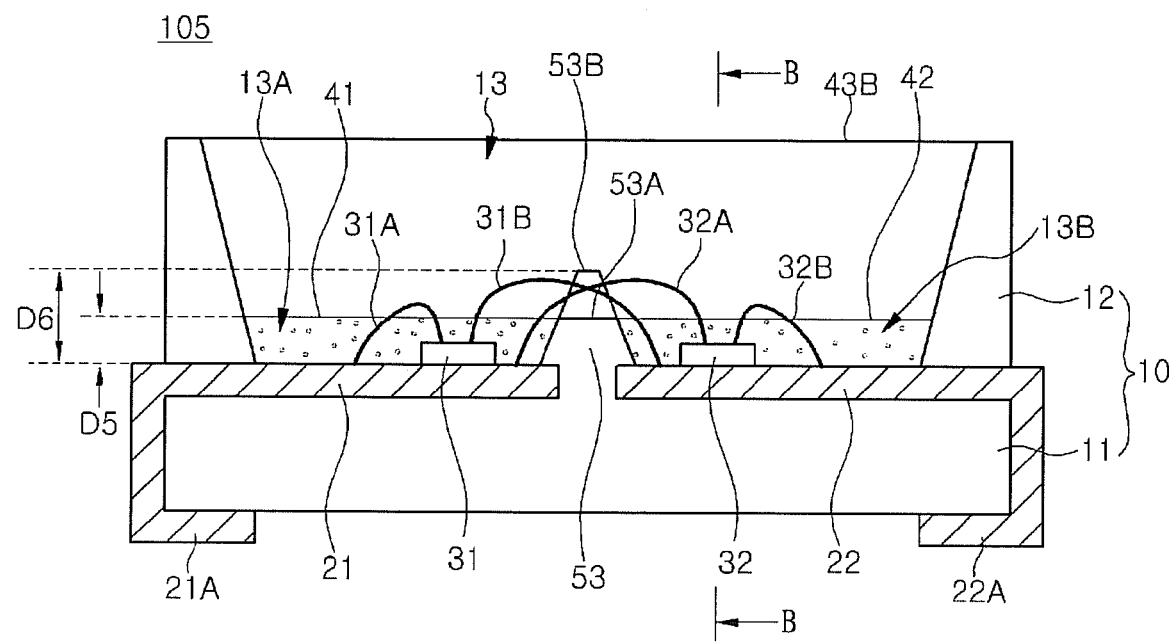
FIG. 11 is a sectional view of a light emitting device according to the sixth embodiment.
Figure 12:
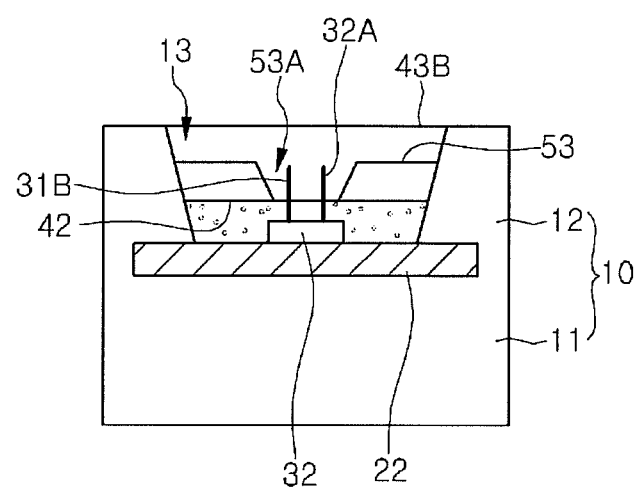
FIG. 12 is a side sectional view of FIG. 11.

FIG. 11 is a sectional view of a light emitting device according to the sixth embodiment, and FIG. 12 is a side sectional view taken along line B-B of FIG. 11.

Referring to FIG. 11, the light emitting device 105 may comprise a barrier section 53 having a stepped concave part 53A. At least one concave part 53A may be formed in the barrier section 53. The concave part 53 has the height D5 lower than a top surface of the barrier section 53. The top surface of the barrier section 53 may be equal to or lower than a top surface of the reflective part 12, but the embodiment is not limited thereto.

First and second regions 13A and 13B of the recess 13 may have a depth corresponding to a depth of the concave part 53A based on the barrier section 53. The depth of the concave part 53A of the barrier section 53 may be larger than the thickness of the first and second light emitting diodes 31 and 32 based on the bottom surface of the recess 13.

The concave part 53A of the barrier section 53 may serve as a passage for a first wire 31B for connecting the first light emitting diode 31 to the second lead electrode 22 and a second wire 32A for connecting the second light emitting diode 32 to the first lead electrode 21. Since the concave part 53A serves as the passage for the first and second wires 31B and 31A, the height of the wires 31B and 31A may not be increased even if the height of the barrier section 53 is increased.

As shown in FIG. 12, the bottom surface of the concave part 53A may be flat or convex and both lateral sides of the concave part 53A may be inclined or perpendicular to the bottom surface of the recess 13 in correspondence with each other.

As shown in FIGS. 11 and 12, first to third resin layers 41, 42 and 43B are formed in the recess 13. The first and second resin layers 41 and 42 may extend corresponding to the height D5 of the concave part 53A of the barrier section 53 from both sides of the bottom surface of the recess 13. In this case, the top surface of the first and second resin layers 41 and 42 may be lower than the highest point of the wires 31A, 31B, 32A and 32B.

In addition, the first and second resin layers 41 and 42 may have a thickness corresponding to the height of the top surface of the barrier section 53. In this case, the first and second resin layers 41 and 42 may be higher than the highest point of the wires 31A, 31B, 32A and 32B.

According to the embodiment, the concave part 53A of the barrier section 53 may serve as the passage for the wires, so that the height of the barrier section may be increased as compared with that of other embodiments.

Figure 13:
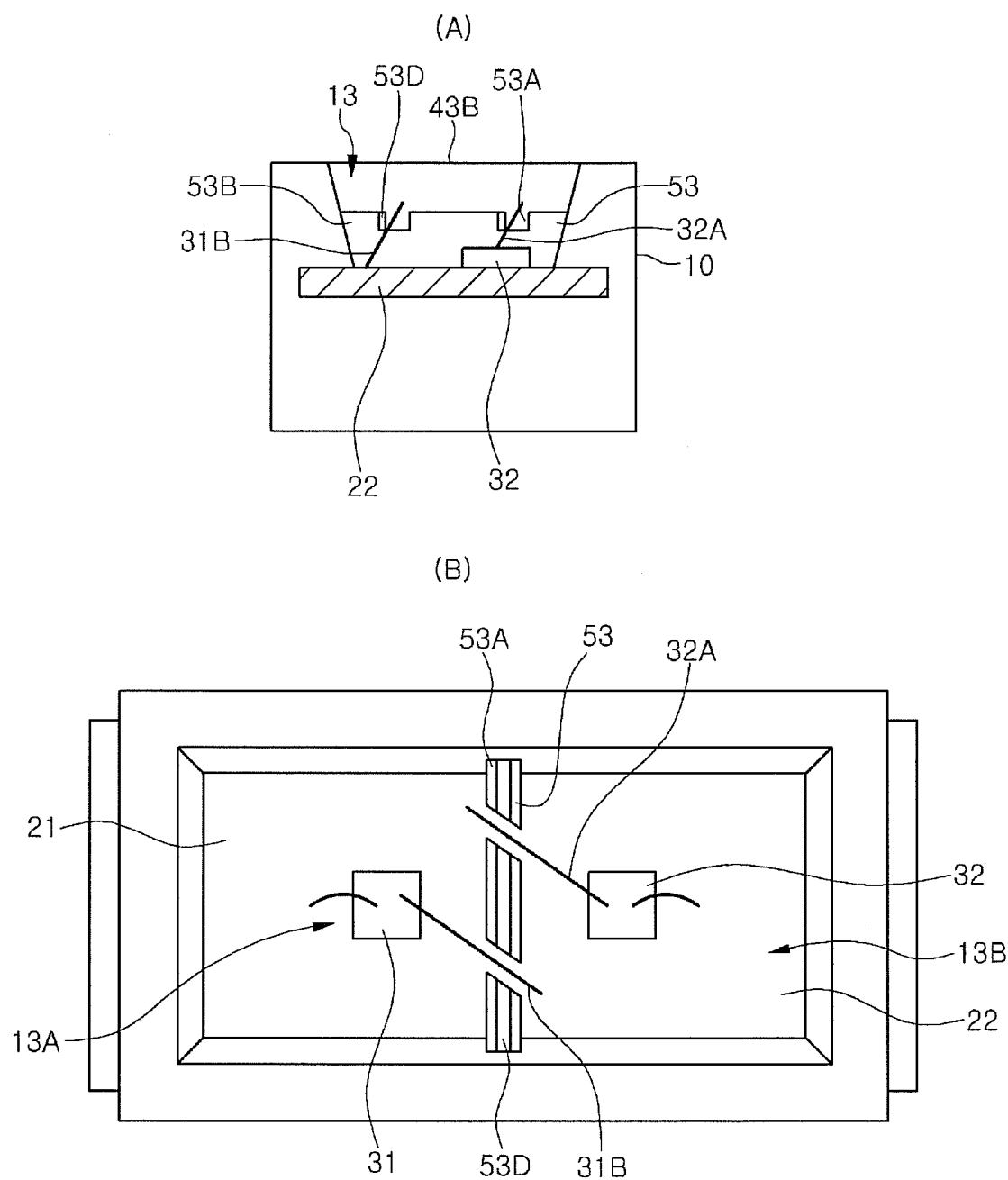
FIG. 13 is a sectional view of a light emitting device according to another embodiment.

Referring to FIGS. 13 (A) and (B), the barrier section 53 may comprise a plurality of concave parts 53A and 53D. The concave parts 53A and 53D may be formed in the route of the wires 31B and 31A with a predetermined depth. Both side walls of the concave parts 53A and 53D may be inclined in the direction same to the extension direction of a virtual line drawn from one end to the other end of the wires.

Figure 14:
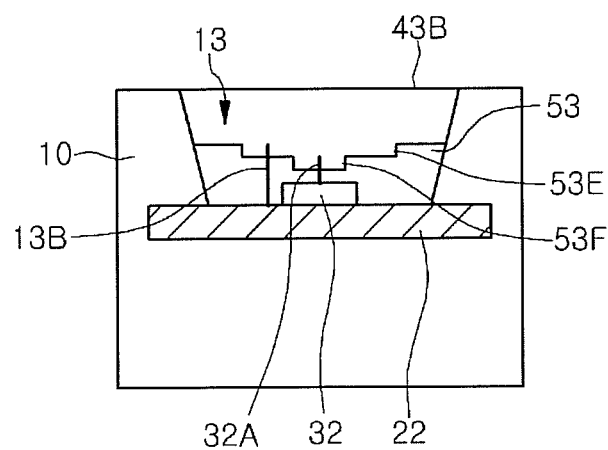
FIG. 14 is a sectional view of a light emitting device according to still another embodiment.

Referring to FIG. 14, concave parts 53E and 53F are formed on the top surface of the barrier section 53. The concave parts 53E and 53F are stepped at least two times. The concave parts 53E and 53F have a two-stepped structure lower than the top surface of the barrier section 53. In this case, the center of the barrier section 53 is the lowest concave part 53F.

Figure 15:
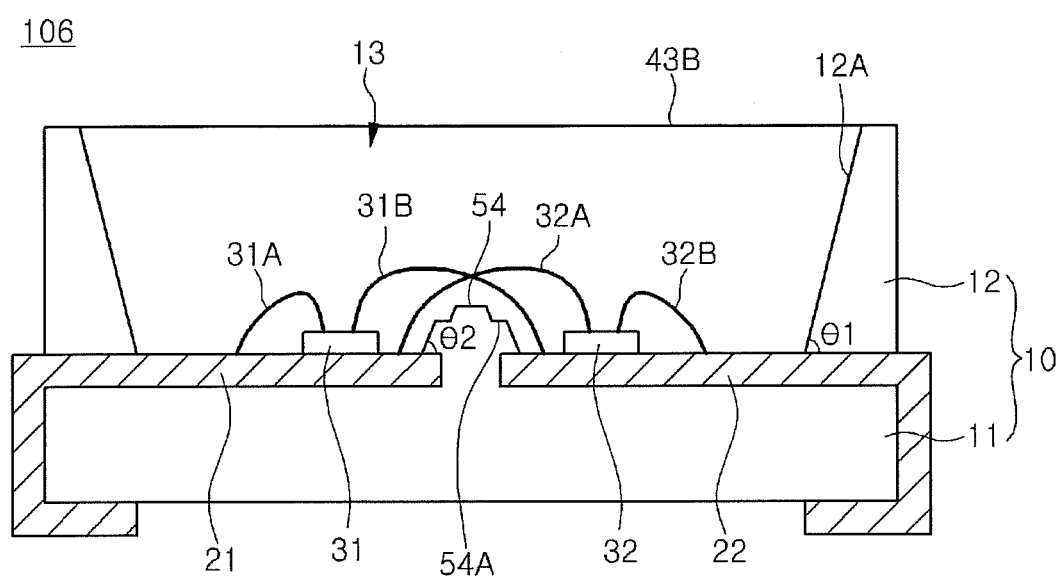
FIG. 15 is a sectional view of a light emitting device according to the seventh embodiment.

FIG. 15 is a sectional view showing a light emitting device according to the seventh embodiment.

Referring to FIG. 15, the light emitting device 106 may comprise a barrier section 54 having a stepped sidewall in the recess 13. A stepped structure 54A of the barrier section 54 may be formed at the inclined sidewall of the barrier section 54 in the form of a one-stepped structure or a two-stepped structure. The stepped sidewall corresponds to both sidewalls 12A of the body 10. The stepped structure 54A of the barrier section 54 extends lengthwise along the barrier section 54.

The stepped structure 54A of the barrier section 54 may reinforce adhesive strength of the resin layer 43B. The barrier section 54 may have a bar shape, a bending shape or a curved shape and may be formed along a straight line or an oblique line. A part of the barrier section 54 may be parallel to the lateral side of the recess 13, but the embodiment is not limited thereto.

Figure 16:
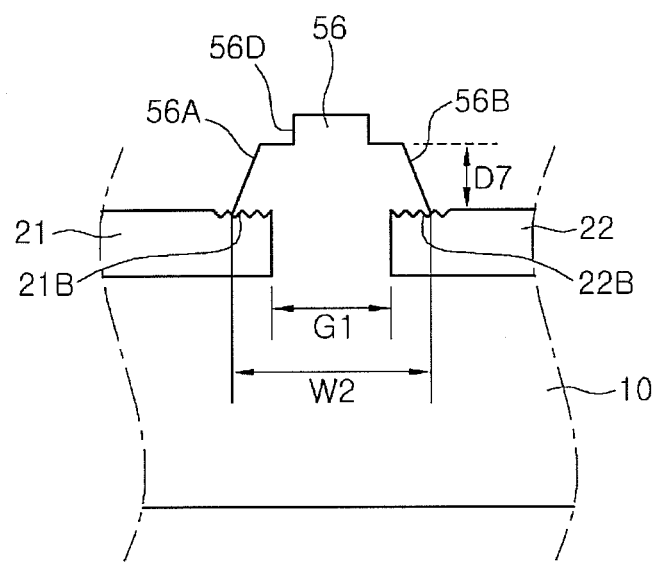
FIG. 16 is a partially enlarged view of a light emitting device according to another embodiment.

The stepped structure of the barrier section 54 may be slantingly connected to the top surface of the barrier section 54 or perpendicularly connected to the top surface of the barrier section 54 as shown in FIG. 16.

Referring to FIG. 16, the first lead electrode 21 is spaced apart from the second lead electrode 22 with a predetermined gap G1 and concavo-convex structures 21B and 22B may be formed on the top surface of the first and second lead electrodes 21 and 22. A lower width W2 of the barrier section 56 may be larger than the gap G1. A bottom surface of the barrier section 56 has a structure corresponding to the concavo-convex structures 21B and 22B of the first and second lead electrodes 21 and 22.

The height of a stepped structure 56D at the both lateral sides 56B of the barrier section 56 may correspond to the thickness of the light emitting diode, but the embodiment is not limited thereto.

Figure 17:
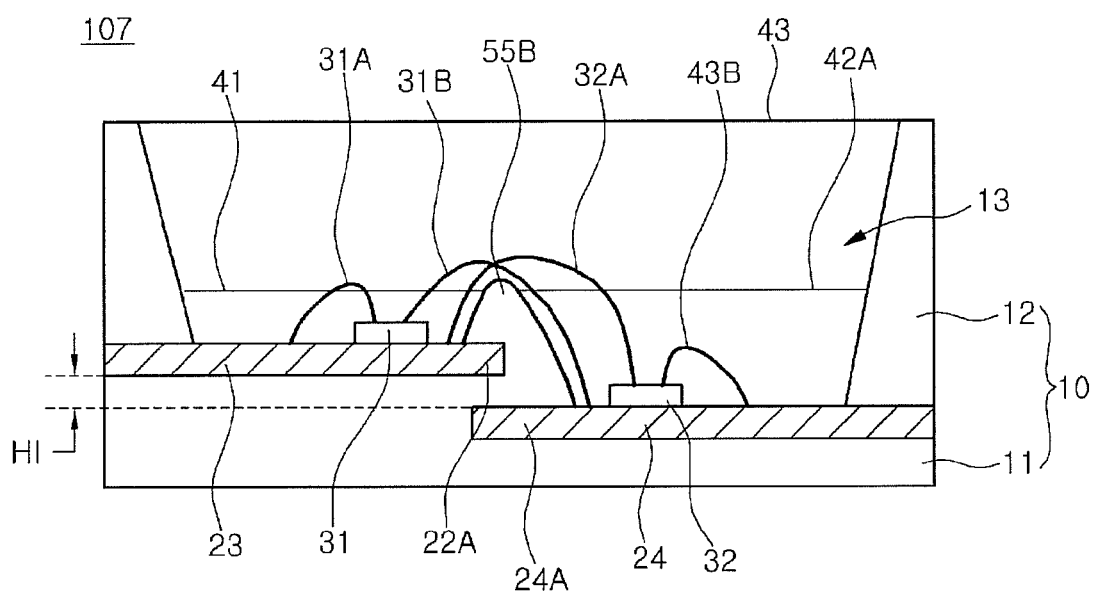
FIG. 17 is a sectional view of a light emitting device according to the eighth embodiment.

FIG. 17 is a sectional view showing a light emitting device according to the eighth embodiment.

Referring to FIG. 17, the light emitting device 107 may comprise first and second lead electrodes 23 and 23 aligned on different planes in the recess 13. The first lead electrode 23 may be aligned higher than the second electrode 24 in the recess 13 by a predetermined distance H1.

A barrier section 55B may be disposed between the first and second lead electrodes 23 and 24 and the height of one lateral side of the barrier section 55B may be different from the height of the other lateral side of the barrier section 55B, so that the stepped structure of the lead electrodes 23 and 24 can be formed.

In the region of the barrier section 55B, one end of the second lead electrode 24 may overlap with the other end of the first lead electrode 23 in the vertical direction, but the embodiment is not limited thereto.

A second resin layer 42A may be formed on the second lead electrode 24 to cover the second light emitting diode 32. The thickness of the second resin layer 42A may be thicker than the thickness of the first resin layer 41. In this case, a greater amount of phosphors may be added to the second resin layer 42A as compared with the first resin layer 41. Since the thickness of the first resin layer 41 may be different from the thickness of the second resin layer 42A, quantity of light emitted from the first resin layer 41 may be different from quantity of light emitted from the second resin layer 42A. Thus, the color reproduction property may be improved based on the thickness difference between the first and second resin layers 41 and 42A.

Figure 18:
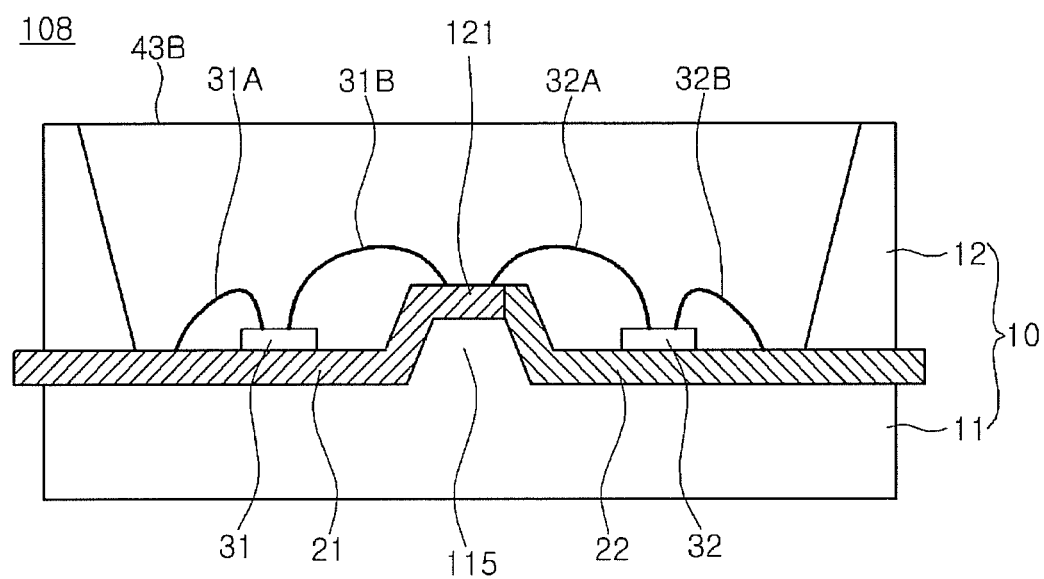
FIG. 18 is a sectional view of a light emitting device according to the ninth embodiment.
Figure 19:
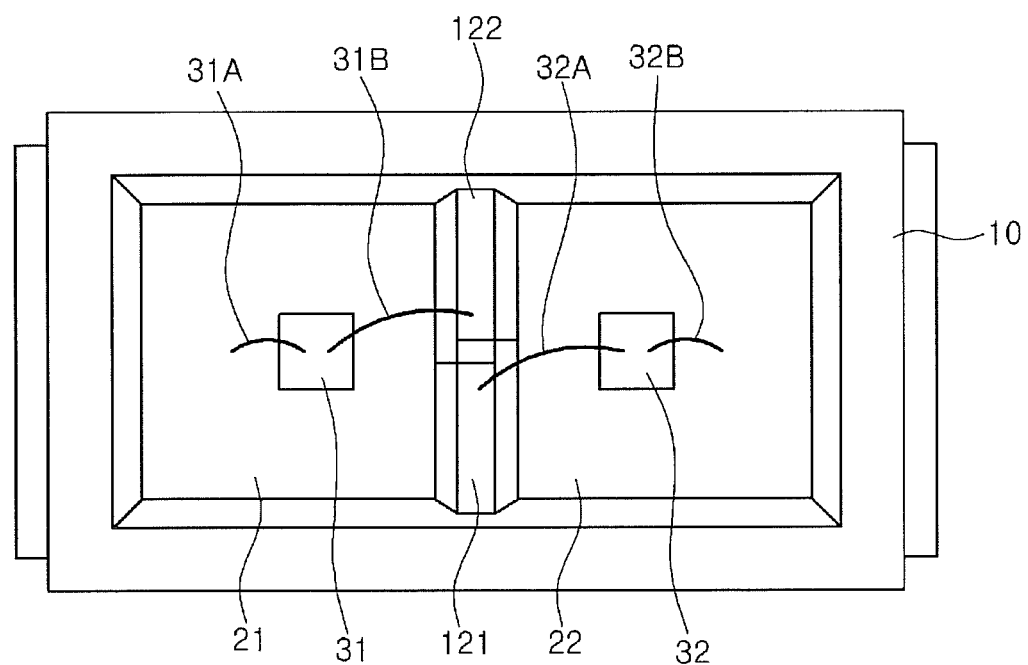
FIG. 19 is a plan view of FIG. 18.

FIG. 18 is a sectional view showing a light emitting device according to the ninth embodiment, and FIG. 19 is a plane view of FIG. 18.

Referring to FIGS. 18 and 19, the light emitting device 108 may comprise a barrier section 115 on which an end portion of the first lead electrode 21 and/or the second lead electrode 22 is disposed.

One end 121 of the first lead electrode 21 extends to one lateral side and one side of a top surface of the barrier section 115, and the other end 122 of the second lead electrode 22 extends to the other lateral side and/or the other side of the top surface of the barrier section 115. In detail, one end 121 of the first lead electrode 21 and the other end 122 of the second lead electrode 22 may extend to the top surface of the barrier section 115 while being physically separated from each other.

Since at least about 60% of the circumference of the barrier section 115 is covered with the first and second lead electrodes 21 and 22, the light reflection efficiency can be improved as compared with that of other embodiments.

In addition, the second wire 31B may be bonded to one end 121 of the first lead electrode 21 formed on one end of the barrier section 115 and the third wire 32A may be bonded to the other end 122 of the second lead electrode 22. Thus, the wire may not be disposed in other regions and the length of the wire can be reduced. Since the length of the wire can be reduced, the open of the wire can be prevented.

According to the embodiment, the end portion of the first lead electrode 21 extends to the upper portion of the barrier section 155. However, according to another embodiment, the end portion of the first lead electrode 21 and/or the second lead electrode 22 may extend to the recess region. In this case, the wire bonding can be performed in each region of the recess 13.

Figure 20:
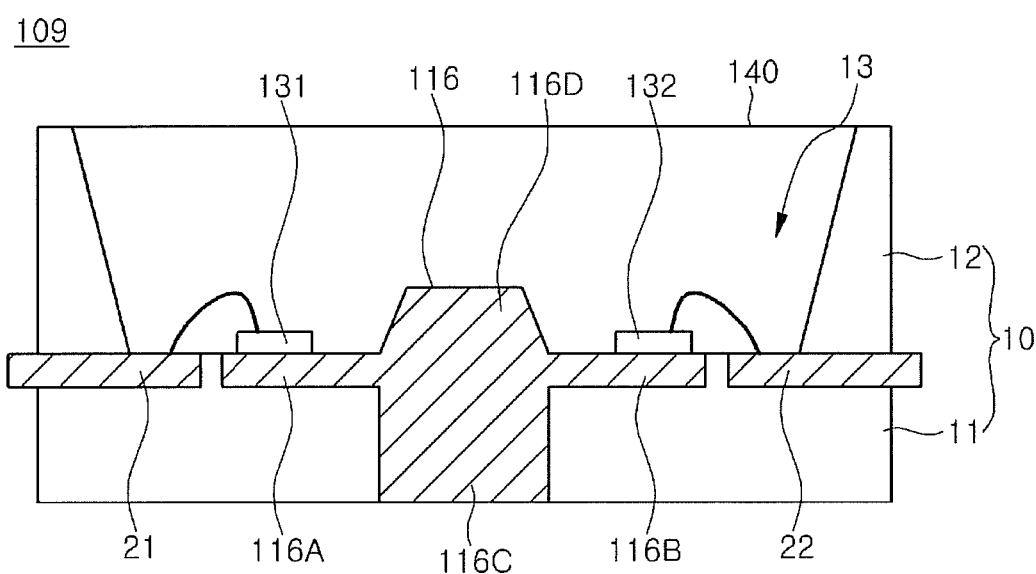
FIG. 20 is a sectional view of a light emitting device according to the tenth embodiment.

FIG. 20 is a sectional view showing a light emitting device according to the tenth embodiment.

Referring to FIG. 20, the light emitting device 109 may comprise a heat dissipation frame 116. The heat dissipation frame 116 may be interposed between the first and second lead electrode 21 and 22 and the first and second light emitting diodes 131 and 132 may be provided on the first and second lead electrode 21 and 22, respectively. The heat dissipation frame 116 may comprise bonding sections 116A and 116b disposed on the bottom surface of the recess 13, a barrier section 116D dividing the bottom surface of the recess 13, and a heat dissipation section 116C extending to the bottom surface of the body 10. The barrier section 116D may comprise a conductive material. The barrier section 116D serves as a barrier for the light emitting diodes 131 and 132 at the bottom surface of recess 13 and reflects the incident light.

The heat dissipation section 116C transmits the heat generated from the light emitting diodes 131 and 132 to the downward direction, thereby improving the heat dissipation efficiency. The heat dissipation section 116C may have an electrode function. The heat dissipation section 116C may be designed to have only a heat dissipation function.

The bonding sections 116A and 116B extend outward from both sides of the barrier section 116D. The light emitting diodes 131 and 132 are mounted on the bonding sections 116A and 116B, respectively.

Figure 21:
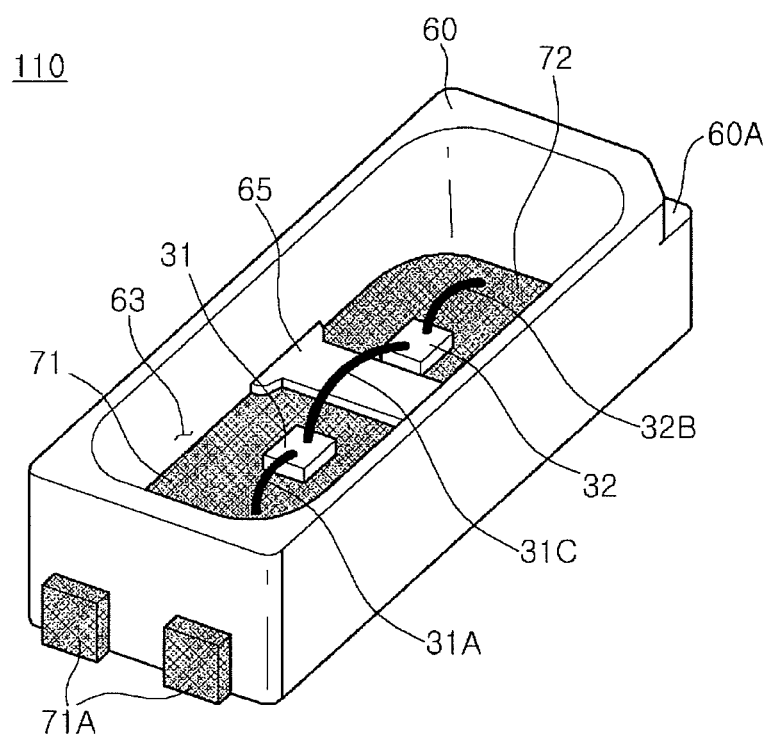
FIG. 21 is a perspective view of a light emitting device according to the eleventh embodiment.
Figure 22:
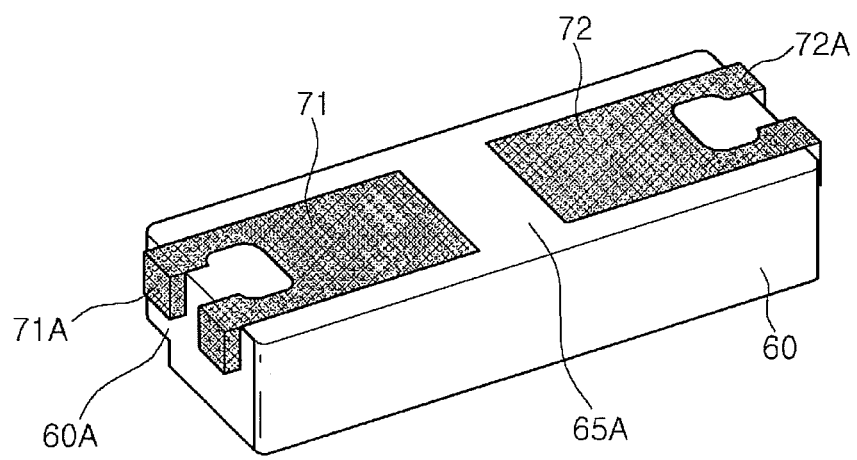
FIG. 22 is a bottom view of FIG. 21.
Figure 23:
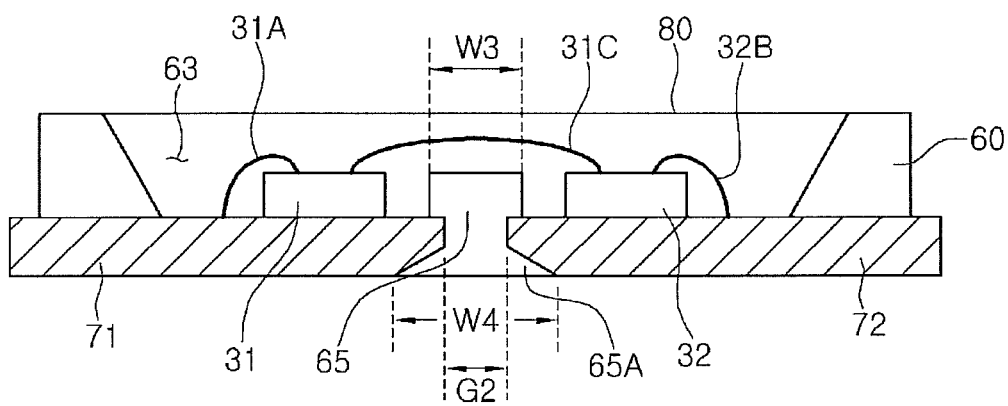
FIG. 23 is a sectional view of FIG. 21.

FIG. 21 is a perspective view of a light emitting device according to the eleventh embodiment, FIG. 22 is a bottom view of FIG. 21, and FIG. 23 is a sectional view of FIG. 21.

Referring to FIGS. 21 to 23, the light emitting device 110 may comprise first and second lead electrodes 71 and 72 and the body 60. The bottom surfaces of the first and second lead electrodes 71 and 72 are aligned in line with the bottom surface of the body 60. A cathode mark 60A may be formed on a part of the body 60.

The other end 71A of the first lead electrode 71 may protrude out of the body 60 and one side 72A of the second lead electrode 72 may protrude out of the body 60 in opposition to the other end 71A of the first lead electrode 71.

The barrier section 65 protrudes between the first and second lead electrodes 71 and 72 and comprises a material same to the material for the body 60. At least the top surface of the barrier section 65 is disposed higher than the top surface of the light emitting diodes 31 and 32.

The barrier section 65 mat have a bar shape. The barrier section 65 may have a constant width or the width of the barrier section 65 may vary depending on positions in the barrier section 65.

The first and second lead electrodes 71 and 72 may be symmetrically disposed. Such a symmetrical structure can dissipate the heat generated from the light emitting diodes 31 and 32.

The light emitting diodes 31 and 32 are connected to each other in series. The first light emitting diode 31 mounted on the first lead electrode 71 is directly connected to the second light emitting diode 32 mounted on the second lead electrode 72 through a wire 31C.

Referring to FIG. 23, an upper width W3 of the barrier section 65 may be larger than a gap G2 formed between the first lead electrode 71 and the second lead electrode 72 and a width W4 of a bottom surface 65A may be larger than the upper width W3.

Figure 24:
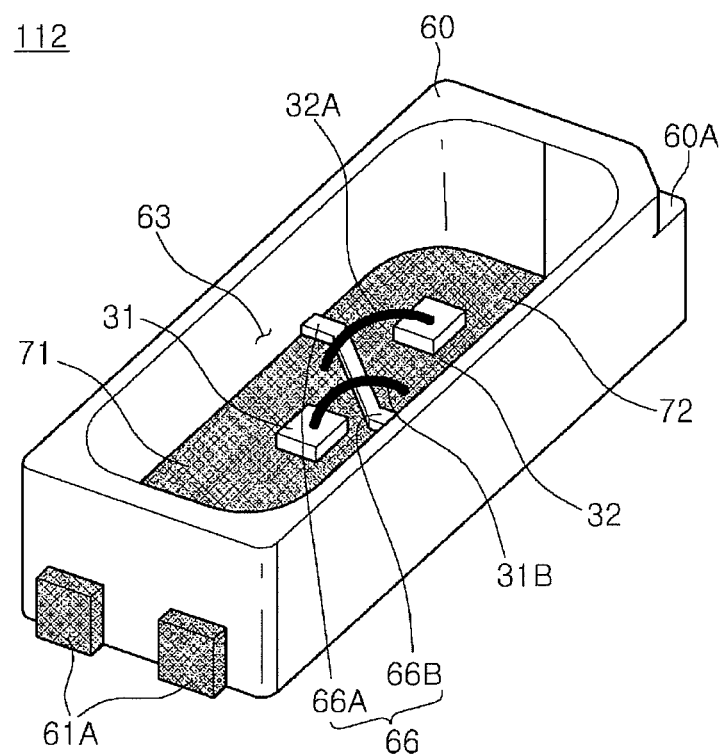
FIG. 24 is a sectional view of a light emitting device according to the twelfth embodiment.

FIG. 24 is a sectional view of a light emitting device according to the twelfth embodiment.

Referring to FIG. 24, the light emitting device 112 may comprise a barrier section 66 having an oblique structure between the first and second lead electrodes 71 and 72. One side 66A of the barrier section 66 is directed to the second lead electrode 72 and the other side 66B of the barrier section 66 is directed to the first lead electrode 71 about the center of the barrier section 66 or the center of the recess 13.

Since the barrier section 66 has the oblique structure, one side of the first lead electrode 71 may more extend toward the second lead electrode 72 and the other side of the second lead electrode 72 may move extend toward the first lead electrode 71. One side of the first lead electrode 71 is connected to the second light emitting diode 32 through a wire 32A, and the other side of the second lead electrode 72 is connected to the first light emitting diode 71 through a wire 31b. Thus, the wire 32A connected to the first lead electrode 71 is offset from the wire 32B connected to the second lead electrode 72.

At least one concave part can be provided in the barrier section 66, but the embodiment is not limited thereto.

Figure 25:
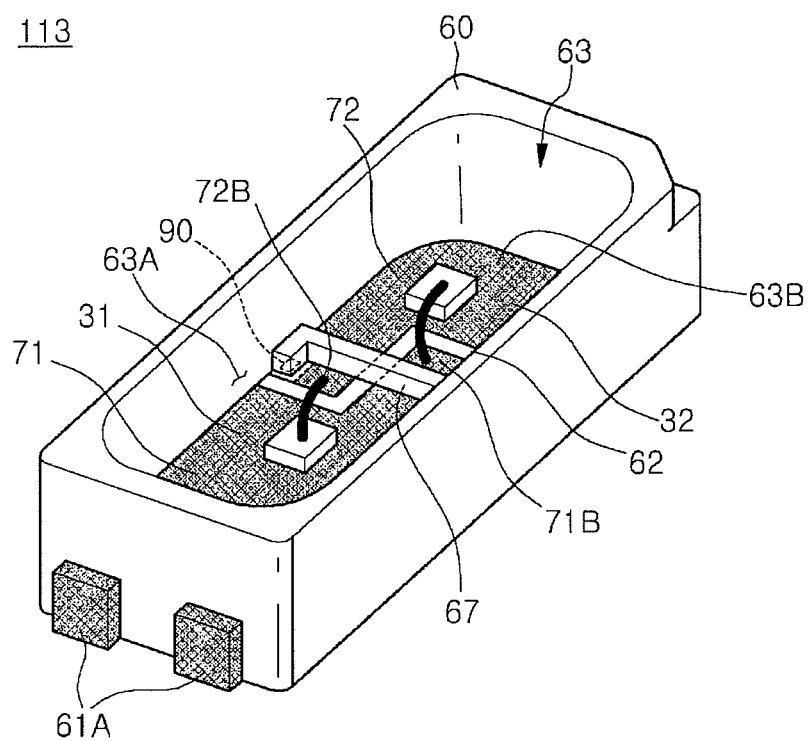
FIG. 25 is a sectional view of a light emitting device according to the thirteenth embodiment.

FIG. 25 is a sectional view of a light emitting device according to the thirteenth embodiment.

Referring to FIG. 25, the light emitting device 113 may comprise a division section 62 formed between the first and second lead electrodes 71 and 72 and a barrier section 67 dividing the bottom surface of a recess 63 into at least two regions 63A and 63B. The division section 62 is aligned in the same line with the top surface of the first and second lead electrodes 71 and 72 and may comprise a material same to the material for the body 10.

One side of the division section 62 is directed to the first lead electrode 71 and the other side of the division section 62 is directed to the second lead electrode 72 about the barrier section 67. Thus, one end of the second lead electrode 72 extends toward the first lead electrode 71 between the barrier section 67 and one side of the division section 62 and a part of the first lead electrode 71 extends toward the second lead electrode 72 between the barrier section 67 and the other side of the division section 62.

The first lead electrode 71 and one end 72B of the second lead electrode 72 are disposed in a first region 63A of the recess 63 about the barrier section 67. In addition, the second lead electrode 72 and one end 71B of the first lead electrode 71 are disposed in a second region 63B of the recess 63 about the barrier section 67. Thus, the first light emitting diode 31 is mounted on the first lead electrode 71 disposed in the first region 63A of the recess 63 and electrically connected to one end 72B of the second lead electrode 72 through a wire 31B. In addition, the second light emitting diode 32 is mounted on the second lead electrode 72 disposed in the second region 63B of the recess 63 and electrically connected to one end 71B of the first lead electrode 71 through a wire 32A.

In detail, the wire 31B connected to the first light emitting diode 31 may be connected to one end 72B of the second lead electrode 72 even if the wire 31B may not extend over the barrier section 67 so as to connected to the second lead electrode 72. In addition, the wire 32A connected to the second light emitting diode 32 may be connected to one end 71B of the first lead electrode 71 even if the wire 32A may not extend over the barrier section 67 so as to connected to the first lead electrode 71.

In addition, a protective device 90, such as a Zener diode, may be embedded into a part of the barrier section 67. In this case, the light loss can be reduced due to the protective device 90.

Figure 26:
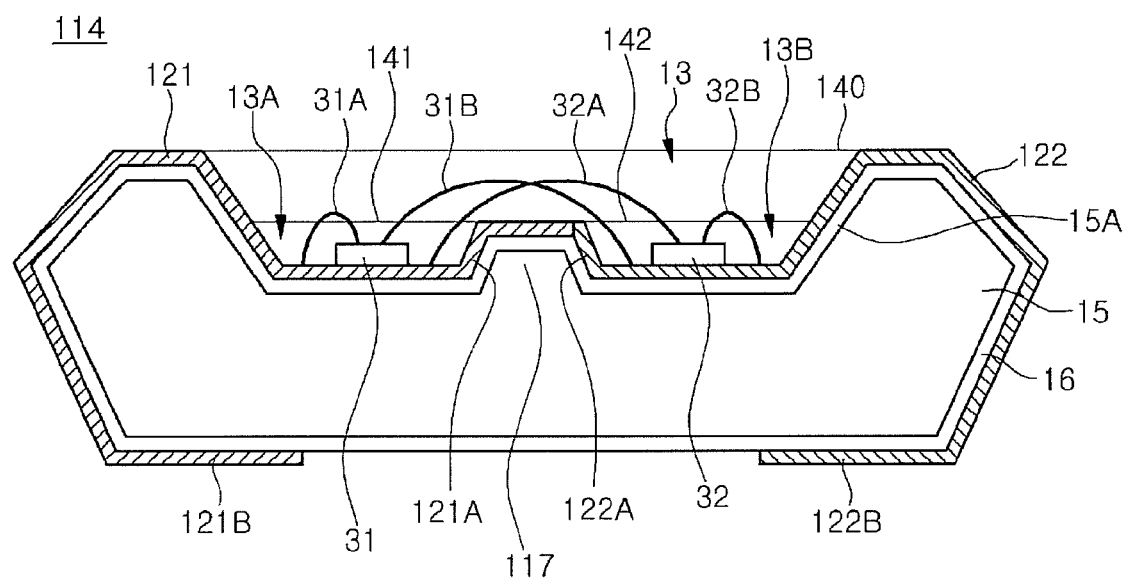
FIG. 26 is a sectional view of a light emitting device according to the fourteenth embodiment.

FIG. 26 is a sectional view of a light emitting device according to the fourteenth embodiment.

Referring to FIG. 26, the light emitting device 114 may be prepared in the form of a wafer level package. The light emitting device 114 may comprise the recess 13 having a predetermined depth. The recess 13 may be formed by etching a body 15.

For instance, the body 15 may be prepared as a wafer level package (WLP) by using a silicon material. The body 15 may be formed by using Si, Al, AlN, $AlO_x$, PSG (photo sensitive glass), $Al_2O_3$, or BeO. Silicon (Si) has advantages in terms of the fabricating efficiency of the package and the heat dissipation efficiency, so the silicon may be used for the body 15 in the embodiment.

The body 15 may be etched through a bulk etching process. The etching process may comprise at least one of a wet etching process, a dry etching process, and a laser drilling process. At least two of the above processes may be simultaneously used. A deep reactive ion etching process is a representative process of the dry etching process.

The body 15 may be formed with the recess 13 having an open top surface. When viewed from the top, the body 15 may have a bath tub type concave shape, a polygonal concave shape or a circular concave shape, but the embodiment is not limited thereto. In order to form the recess 13, a patterning process is performed by using a mask and then the wet etching process is performed by using anisotropic wet etchant, such as KOH, TMAH or EDP.

A sidewall 15A of the recess 13 of the body 15 may be inclined with respect to the bottom surface of the recess 13 at a predetermined angle or a predetermined curvature, or perpendicular to the bottom surface of the recess 13, but the embodiment is not limited thereto. An outer side of the body 15 may be bent at a predetermined angle. In addition, the outer side of the body 15 may be perpendicularly formed.

An insulating layer 16 may be formed on the body 15. The insulating layer 16 may comprise at least one selected from the group consisting of a silicon thermal oxide layer ($SiO_2$ or $Si_xO_y$), AlOx, a silicon nitride layer ($Si_3N_4$, $Si_xN_y$, or $SiO_xN_y$), AlN and $Al_2O_3$, but the embodiment is not limited thereto.

A recess region of the body 15 may have a thickness thinner than a thickness of other regions of the body 15. Such a thickness difference may vary depending on the etching degree.

At least one well may be formed in the body 15. The well may be formed by implanting or diffusing conductive impurities onto the top surface and/or the bottom surface of the body 15. The well is connected to at least one of the lead electrodes 121 and 122 to form a protective device, such as a Zener diode, or a constant current device.

The lead electrodes 121 and 122 may be formed as a single layer or a multiple layer through the deposition process and/or the plating process. The lead electrodes 121 and 122 may have the stack structure, such as Cr/Au/Cu/Ni/Au, Cr/Cu/Cu/Ni/Au, Ti/Au/Cu/Ni/Au, Ta/Cu/Cu/Ni/Au, or Ta/Ti/Cu/Cu/Ni/Au.

A reflective metal and/or a bonding metal may be formed on the uppermost layer of the lead electrodes 121 and 122, but the embodiment is not limited thereto.

The first light emitting diode 31 may be mounted on the first lead electrode 121 and the second light emitting diode 32 may be mounted on the second lead electrode 122.

A barrier section 117 protrudes in the recess 13. The barrier section 117 may be formed when the body is etched. The barrier section 117 may comprise a material same to the material for the insulating layer 16.

The first lead electrode 121 extends to the bottom surface of the body 15 along one side of the body 15 in the recess 13 to form an electrode terminal 121B, and the second lead electrode 122 extends to the bottom surface of the body 15 along the other side of the body 15 in the recess 13 to form an electrode terminal 122B. The first and second lead electrodes 121 and 122 are spaced apart from each other in the recess 13 and separated from each other, electrically and physically.

A part 121A of the first lead electrode 121 may extend to a lateral side and a top surface of the barrier section 117, and a part 122A of the second lead electrode 122 may extend to the lateral side and the top surface of the barrier section 117. Thus, end portions of the first and second lead electrodes 121 and 122 are disposed in different regions on the barrier section 117.

In addition, end portions of the first and second lead electrodes 121 and 122 may extend to another region over the barrier section 117, but the embodiment is not limited thereto.

The wire 31B connected to the first light emitting diode 31 may be bonded to the second lead electrode 122 disposed in the second region 13B, and the wire 32A connected to the second light emitting diode 32 may be bonded to the first lead electrode 121 disposed in the first region 13A.

The first light emitting diode 31 may be disposed in the first region 13A, and the second light emitting diode 32 may be disposed in the second region 13B. A first resin layer 141 may be disposed in the first region 13A and a second resin layer 142 may be disposed in the second region 13B. Phosphors may be added to the first and second resin layers 141 and 142. For instance, red phosphors may be added to the first and second resin layers 141 and 142. The first light emitting diode 31 may comprise a blue light emitting diode, and the second light emitting diode 32 may comprise a green light emitting diode. Thus, the lights having colors of blue, green and red may be emitted, so that the white light can be provided.

The red light may be emitted through the first and second regions 13A and 13B of the recess 13, most of the blue light may be emitted through the first region 13A of the recess 13, and most of the green light may be emitted through the second region 13B of the recess 13. The number of the second light emitting diodes 32 may be larger than the number of the first light emitting diodes 31, but the embodiment is not limited thereto. In addition, a single resin layer may be formed in the recess 13, but the embodiment is not limited thereto.

Figure 27:
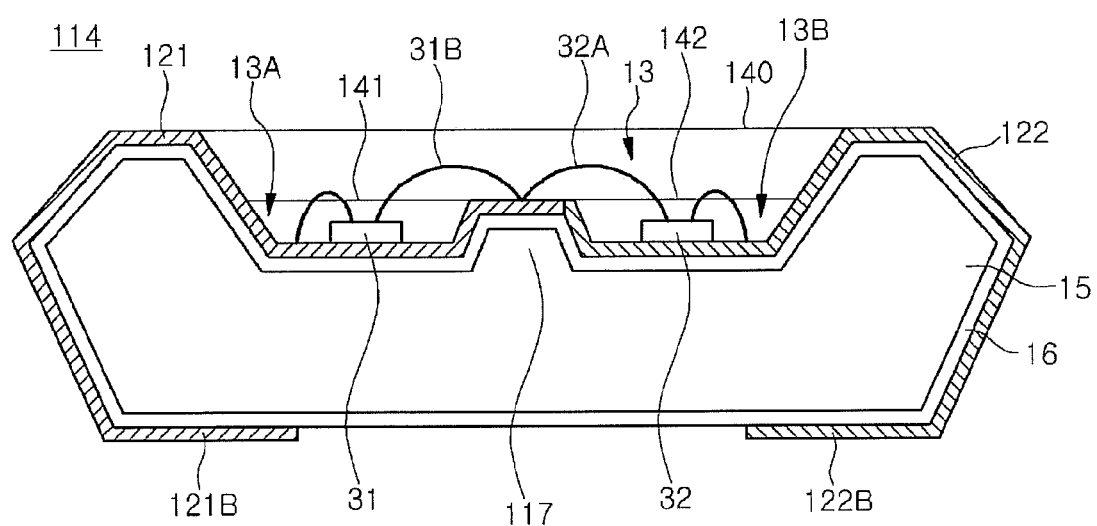
FIG. 27 is a sectional view of a light emitting device according to another embodiment.
Figure 28:
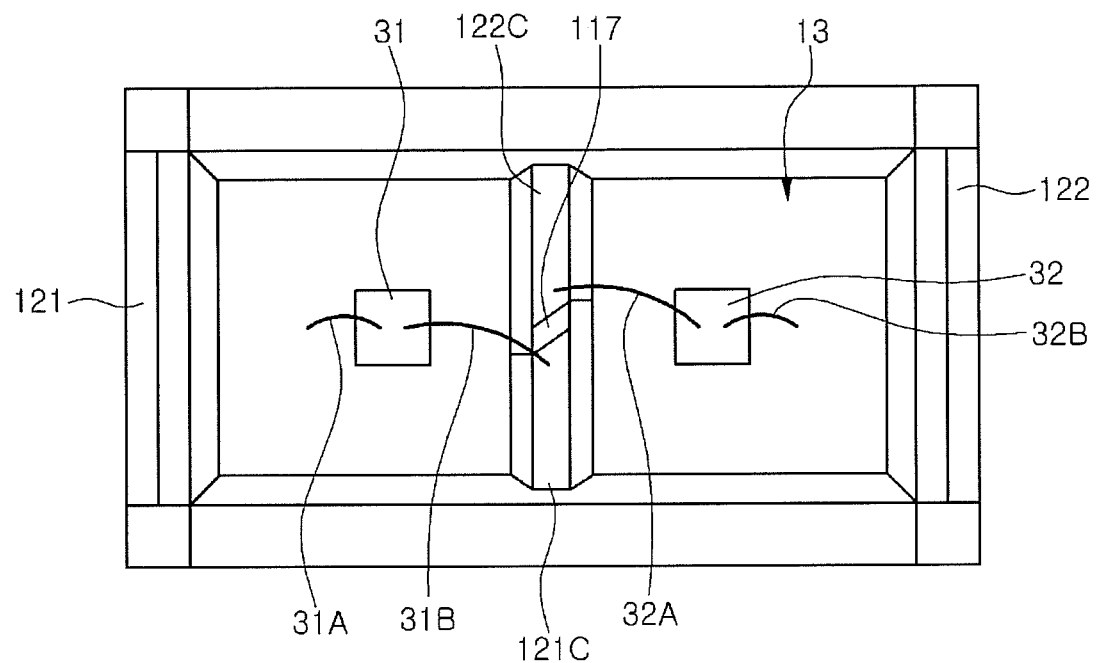
FIG. 28 is a plan view of FIG. 27.

FIG. 27 is a sectional view of a light emitting device according to another embodiment and FIG. 28 is a plan view of FIG. 27. The description about the elements and structures described with reference to FIG. 26 may be omitted in order to avoid redundancy.

Referring to FIGS. 27 and 28, wires 31B and 32A are bonded to one end 121C of the first lead electrode 121 and one end 122C of the second lead electrode 122 disposed on the barrier section 117 to reduce the length of the wire. A plurality of wires 31B and 32A having polarities different from each other may be bonded onto the barrier section 117, but the embodiment is not limited thereto.

Although the embodiment has been described in that the light emitting device package has a top view type, the light emitting device package may have a side view type. In the case of the side view type, a heat dissipation characteristic, conductivity, and a reflectance characteristic can be improved. After such a top-view-type or side-view-type light emitting device may be packaged by the resin layer, a lens may be formed on the resin layer or the lens may be bonded with the resin, but the embodiment is not limited thereto.

Figure 29:
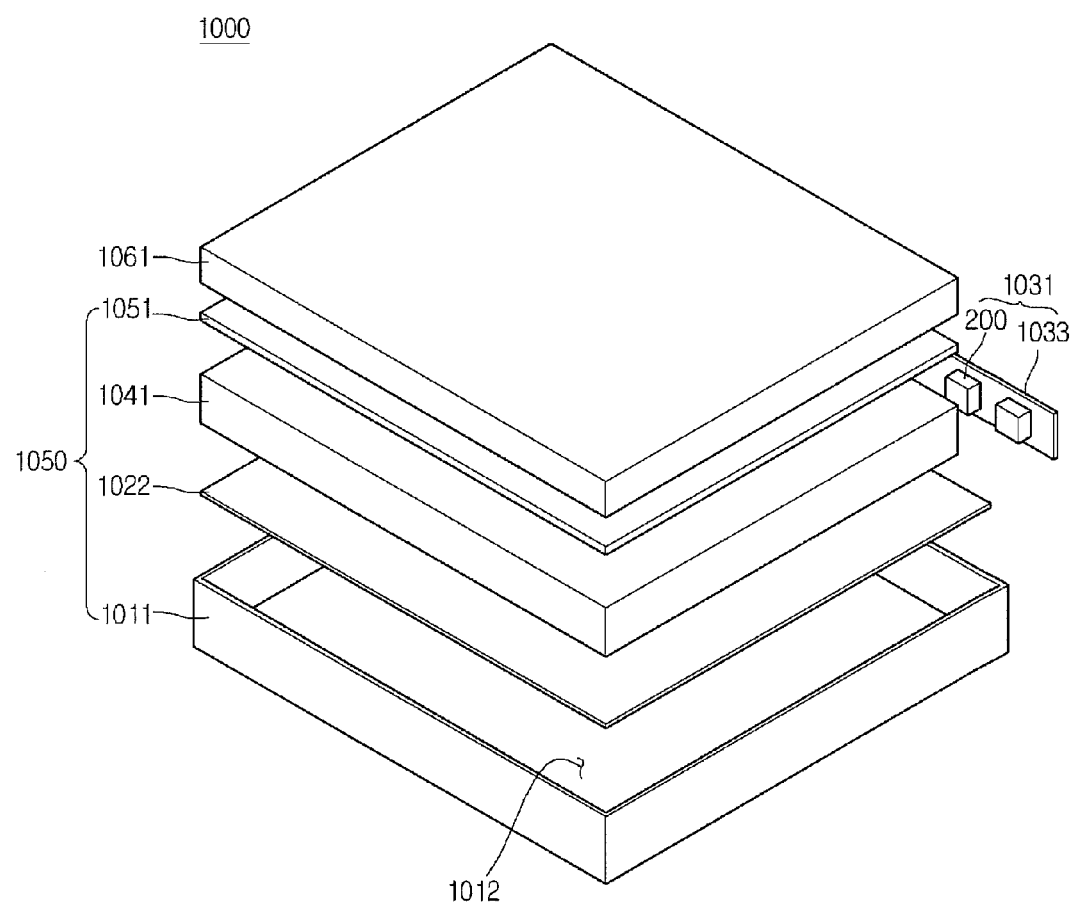
FIG. 29 is an exploded perspective view showing an example of a display device according to the embodiment.
Figure 30:
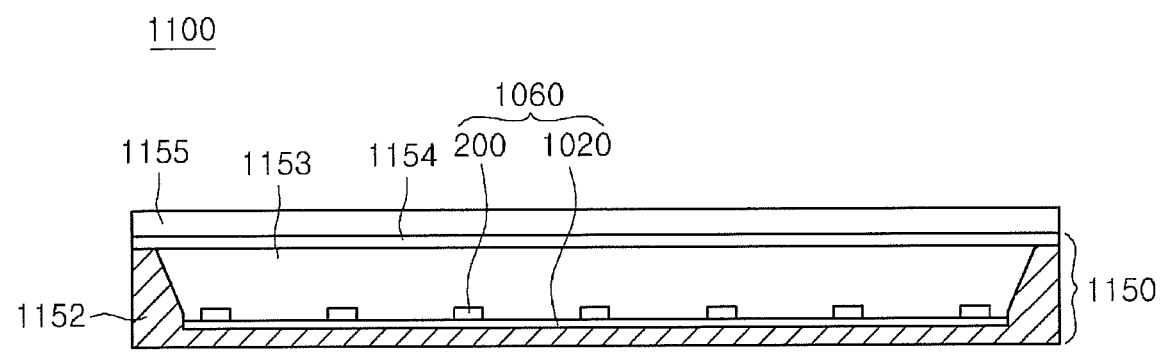
FIG. 30 is a sectional view showing another example of a display device according to the embodiment.
Figure 31:
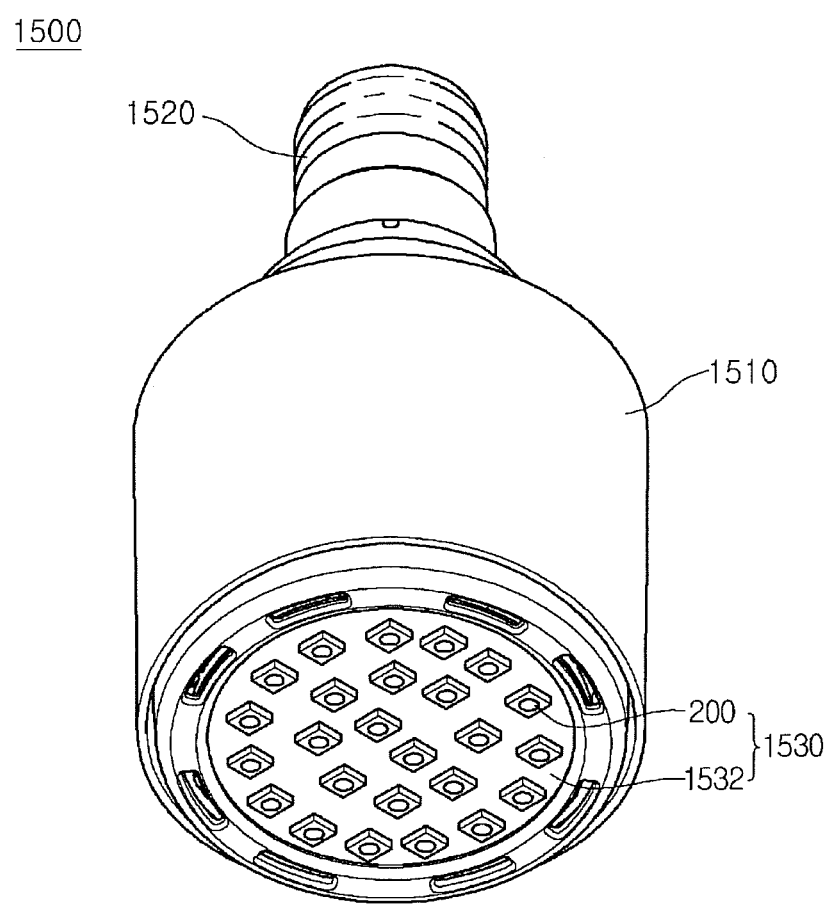
FIG. 31 is a perspective view showing a lighting unit according to the embodiment.

The light emitting device according to the embodiment can be applied to the light unit. The light unit may comprise a plurality of light emitting devices. The light unit may comprise the display device as shown in FIGS. 29 and 30 and the lighting device as shown in FIG. 31. In addition, the light unit having the light emitting device according to the embodiment may comprise a lighting lamp, a signal lamp, a headlight of a vehicle, and an electric signboard.

FIG. 29 is an exploded perspective view showing the display device according to the embodiment.

Referring to FIG. 29, the display device 1000 may comprise a light guide plate 1041, a light emitting module 1031 for supplying the light to the light guide plate 1041, a reflective member 1022 provided below the light guide plate 1041, an optical sheet 1051 provided on the light guide plate 1041, a display panel 1061 provided on the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light supplied from the light emitting module 1031 to provide surface light. The light guide plate 1041 may comprise transparent material. For instance, the light guide plate 1041 may comprise one of acryl-based resin such as PMMA (polymethyl methacrylate, PET (polyethylene terephthalate), PC (polycarbonate), COC (cyclic olefin copolymer) and PEN (polyethylene naphthalate) resin.

The light emitting module 1031 supplies the light to at least one side of the light guide plate 1041. The light emitting module 1031 serves as the light source of the display device.

At least one light emitting module 1031 may be provided to directly or indirectly supply the light from one side of the light guide plate 1041. The light emitting module 1031 may comprise a board 1033 and the light emitting devices 200 according to the embodiments. The light emitting devices 200 may be arrayed on the board 1033 while being spaced apart from each other at the predetermined interval.

The board 1033 may comprise a printed circuit board (PCB) having a circuit pattern. In addition, the board 1033 may also comprise a metal core PCB (MCPCB) or a flexible PCB (FPCB), but the embodiment is not limited thereto. If the light emitting devices 200 may be provided on the side of the bottom cover 1011 or on a heat dissipation plate, the board 1033 may be omitted. The heat dissipation plate partially makes contact with the top surface of the bottom cover 1011.

In addition, the light emitting devices 200 may be arranged such that light exit surfaces of the light emitting devices 200 are spaced apart from the light guide plate 1041 by a predetermined distance, but the embodiment is not limited thereto. The light emitting devices 200 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, in the upward direction, thereby improving the brightness of the light unit 1050. For instance, the reflective member 1022 may comprise PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an open top surface, but the embodiment is not limited thereto. The bottom cover 1011 may be coupled with a top cover, but the embodiment is not limited thereto.

The bottom cover 1011 may be manufactured through a press process or an extrusion process by using a metallic material or a resin material. In addition, the bottom cover 1011 may comprise metal or non-metallic material having superior thermal conductivity, but the embodiment is not limited thereto.

The display panel 1061, for instance, may be an LCD panel comprising first and second transparent substrates, which are opposite to each other, and a liquid crystal layer interposed between the first and second substrates. A polarizing plate may be attached to at least one surface of the display panel 1061, but the embodiment is not limited thereto. The display panel 1061 displays information by using the light passing through the optical sheet 1051. The display device 1000 may be applied to various portable terminals, monitors of notebook computers, monitors or laptop computers, and televisions.

The optical sheet 1051 may be disposed between the display panel 1061 and the light guide plate 1041 and comprise at least one transitive sheet. For instance, the optical sheet 1051 may comprise at least one of a diffusion sheet, a horizontal and vertical prism sheet, and a brightness enhanced sheet. The diffusion sheet diffuses the incident light, the horizontal and vertical prism sheet concentrates the incident light onto the display region, and the brightness enhanced sheet improves the brightness by reusing the lost light. In addition, a protective sheet may be provided on the display panel 1061, but the embodiment is not limited thereto.

The light guide plate 1041 and the optical sheet 1051 may be provided in the light path of the light emitting module 1031 as optical members, but the embodiment is not limited thereto.

FIG. 30 is a sectional view showing the display device according to the embodiment.

Referring to FIG. 30, the display device 1100 may comprise a bottom cover 1152, a board 1120 on which the light emitting devices 200 are arrayed, an optical member 1154, and a display panel 1155.

The board 1120 and the light emitting devices 200 may constitute the light emitting module 1060. In addition, the bottom cover 1152, at least one light emitting module 1060, and the optical member 1154 may constitute the light unit.

The bottom cover 1151 may be provided with a receiving section 1153, but the embodiment is not limited thereto.

The optical member 1154 may comprise at least one of a lens, a light guide plate, a diffusion sheet, a horizontal and vertical prism sheet, and a brightness enhanced sheet. The light guide plate may comprise PC or PMMA (Poly methyl methacrylate). The light guide plate can be omitted. The diffusion sheet diffuses the incident light, the horizontal and vertical prism sheet concentrates the incident light onto the display region, and the brightness enhanced sheet improves the brightness by reusing the lost light.

The optical member 1154 is disposed on the light emitting module 1060 in order to convert the light emitted from the light emitting module 1060 into the surface light. In addition, the optical member 1154 may diffuse or concentrate the light.

FIG. 31 is a perspective view showing a lighting device according to the embodiment.

Referring to FIG. 31, the lighting device 1500 may comprise a case 1510, a light emitting module 1530 provided in the case 1510, and a connection terminal 1520 provided in the case 1510 to receive power from an external power source.

Preferably, the case 1510 may comprise a material having superior heat dissipation property. For instance, the case 1510 may comprise a metallic material or a resin material.

The light emitting module 1530 may comprise a board 1532 and light emitting devices 200 provided on the board 1532. The light emitting devices 200 may be spaced apart from each other or arrayed in the form of a matrix.

The board 1532 may comprise an insulating member printed with a circuit pattern. For instance, the board 1532 may comprise at least one of a PCB, an MCPCB, an FPCB, a ceramic PCB, and an FR-4 substrate.

In addition, the board 1532 may comprise a material that effectively reflects the light. A coating layer may be formed on the surface of the substrate 1532. At this time, the coating layer has a white color or a silver color to effectively reflect the light.

At least one light emitting device 200 may be provided on the board 1532. Each light emitting device 200 may comprise at least one LED (light emitting diode) chip. The LED chip may comprise an LED that emits the light of visible ray band having red, green, blue or white color and a UV (ultraviolet) LED that emits UV light.

The light emitting devices 200 of the light emitting module 1530 may be variously combined to provide various colors and brightness. For instance, the white LED, the red LED and the green LED may be combined to achieve the high color rendering index (CRI).

The connection terminal 1520 may be electrically connected to the light emitting module 1530 to supply power to the light emitting module 1530. The connection terminal 1520 may have a shape of a socket screw-coupled with the external power source, but the embodiment is not limited thereto. For instance, the connection terminal 1520 may be prepared in the form of a pin inserted into the external power source or connected to the external power source through a wire.

According to the embodiment, the light emitting devices 200 may be packaged and then mounted on the board to provide the light emitting module, or the light emitting devices 200 may be mounted in the form of the LED chip and then packaged to provide the light emitting module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a body having a first recess;
   a barrier section having a second recess and a third recess, protruding upward over a bottom surface of the first recess, and dividing the bottom surface of the first recess into a first region and a second region;
   a first light emitting diode disposed in the first region of the bottom surface of the first recess;
   a second light emitting diode disposed in the second region of the bottom surface of the first recess;
   a first lead electrode disposed in the first region of the bottom surface of the first recess;
   a second lead electrode disposed in the second region of the bottom surface of the first recess;
   a first wire electrically connecting the first lead electrode to the second light emitting diode through the second recess;
   a second wire electrically connecting the second lead electrode to the first light emitting diode through the third recess;
   a first resin layer in the first region of the first recess;
   a second resin layer in the second region of the first recess; and
   a third resin layer on the first and second resin layers,
   wherein the first resin layer and the second resin layer have a thickness smaller than a height of the second recess of the barrier section from the bottom surface of the first recess.

2. The light emitting device of claim 1, wherein the second recess of the barrier section is spaced apart from the third recess of the barrier section.

3. The light emitting device of claim 1, wherein a top surface of the barrier section is higher than a highest point of the first wire.

4. The light emitting device of claim 1, wherein the first light emitting diode is disposed on the first lead electrode and wherein the second light emitting diode is disposed on the second lead electrode.

5. The light emitting device of claim 1, further comprising at least one type of phosphors added to at least one of the first to third resin layers.

6. The light emitting device of claim 1, wherein the first light emitting diode comprises a blue light emitting diode, wherein the second light emitting diode comprises a green light emitting diode, and wherein a red phosphor is added to the first resin layer and the second resin layer.

7. The light emitting device of claim 1, wherein the first light emitting diode comprises a blue light emitting diode, wherein the second light emitting diode comprises a UV light emitting diode, wherein a red phosphor is added to the first resin layer, and wherein a green phosphor is added to the second resin layer.

8. The light emitting device of claim 1, wherein the barrier section comprises an insulating material or a conductive material.

9. The light emitting device of claim 1, wherein the second recess of the barrier section has a height larger than a thickness of the first light emitting diode when measured from the bottom surface of the first recess.

10. The light emitting device of claim 1, wherein both lateral sides of the barrier section correspond to divided regions of the first recess and comprise a structure inclined or perpendicular to the bottom surface of the first recess.

11. The light emitting device of claim 1, wherein a top surface of the barrier section is lower than a top surface of the body.

12. A light unit comprising:
   a light emitting module comprising a light emitting device and a board on which the light emitting device is arrayed; and
   a light guide plate disposed in a path of a light emitted from the light emitting module,
   wherein the light emitting device comprises:
      a body having a first recess;
      a barrier section having a second recess and a third recess, protruding upward over a bottom surface of the first recess, and dividing the bottom surface of the first recess into a first region and a second region;
      a first light emitting diode disposed in the first region of the bottom surface of the first recess;
      a second light emitting diode disposed in the second region of the bottom surface of the first recess;
      a first lead electrode disposed in the first region of the bottom surface of the first recess;
      a second lead electrode disposed in the second region of the bottom surface of the first recess;
      a first wire electrically connecting the first lead electrode to the second light emitting diode through the second recess;
      a second wire electrically connecting the second lead electrode to the first light emitting diode through the third recess;
      a first resin layer in the first region of the first recess;
      a second resin layer in the second region of the first recess; and
      a third resin layer on the first and second resin layers,
      wherein the first resin layer and the second resin layer have a thickness smaller than a height of the second recess of the barrier section from the bottom surface of the first recess.

13. The light unit of claim 12, wherein the second recess of the barrier section is spaced apart from the third recess of the barrier section.

14. The light unit of claim 12, wherein a top surface of the barrier section is higher than a highest point of the first wire.

15. The light unit of claim 12, wherein the first light emitting diode is disposed on the first lead electrode and wherein the second light emitting diode is disposed on the second lead electrode.

16. The light unit of claim 12, wherein the second recess of the barrier section has a height larger than a thickness of the first light emitting diode when measured from the bottom surface of the first recess.

17. The light unit of claim 12, wherein a top surface of the barrier section is lower than a top surface of the body.

18. The light unit of claim 12, further comprising at least one type of phosphors added to at least one of the first to third resin layers.

19. The light unit of claim 12, wherein the first light emitting diode comprises a blue light emitting diode, wherein the second light emitting diode comprises a green light emitting diode, and wherein a red phosphor is added to the first resin layer and the second resin layer.

20. The light unit of claim 12, wherein the barrier section comprises an insulating material or a conductive material.

* * * * *